United States Patent
Nakatsu

(10) Patent No.: US 6,561,743 B1
(45) Date of Patent: May 13, 2003

(54) PELLET PICKING METHOD AND PELLET PICKING APPARATUS

(75) Inventor: Akira Nakatsu, Shiga (JP)

(73) Assignee: Nec Machinery Corporation, Shiga (JP)

( * ) Notice: Subject to any disclaimer, the term of this patent is extended or adjusted under 35 U.S.C. 154(b) by 24 days.

(21) Appl. No.: 09/709,018

(22) Filed: Nov. 8, 2000

(30) Foreign Application Priority Data

Nov. 9, 1999 (JP) ............................................ 11-318376
May 15, 2000 (JP) ....................................... 2000-141354

(51) Int. Cl.⁷ ............................................... H01L 21/68
(52) U.S. Cl. .................. 414/403; 414/411; 414/416.06; 156/344; 156/584
(58) Field of Search ................................ 414/403, 411, 414/416.06; 156/344, 584

(56) References Cited

U.S. PATENT DOCUMENTS

| 4,778,326 A | * | 10/1988 | Althouse et al. | ............ 414/786 |
| 6,123,800 A | * | 9/2000 | Freund et al. | .............. 156/344 |

FOREIGN PATENT DOCUMENTS

| JP | 36 220 8648 | * | 9/1987 |
| JP | 1-235247 | * | 9/1989 |
| JP | 4-12549 | | 1/1992 |
| JP | 4-365337 | * | 12/1992 |
| JP | 5-335405 | * | 12/1993 |
| JP | 9-246782 | * | 9/1997 |
| JP | 2000-299297 | * | 10/2000 |

* cited by examiner

*Primary Examiner*—Steven A. Bratlie
(74) *Attorney, Agent, or Firm*—Choate, Hall & Stewart

(57) ABSTRACT

A pellet picking apparatus for separating a pellet adhered on an adhesive sheet from the sheet and picking the pellet thus separated is provided, which prevents the pellet from being damaged during the pellet picking process without lowering the productivity. This apparatus comprises (a) a stage having a surface with which a lower face of the adhesive sheet is contacted; the pellet being adhered on an upper face of the sheet; the stage having a suction hole that pulls down the sheet; the suction hole having a suction end to be contacted with the sheet on the surface of the stage; the stage being movable in a horizontal plane with respect to a specific reference position; and (b) a collet for holding the pellet by a suction force; the collet having a suction end to be contacted with the pellet; the collet being capable of holding the pellet by the suction force at the suction end. When the sheet is placed on the surface of the stage in such a way that the pellet on the sheet is located at the reference position, the collet is controlled to hold the pellet by the suction force at the suction end and at the same time, the stage is controlled to hold the sheet at the suction end of the suction hole and to be moved in the horizontal plane with respect to the reference position to thereby detach the sheet from the pellet. The collet is controlled to pick the pellet thus detached from the sheet.

22 Claims, 22 Drawing Sheets

PELLET PICKING METHOD AND PELLET PICKING APPARATUS

BACKGROUND OF THE INVENTION

1. Field of the Invention

The present invention relates to a pellet picking method and a pellet picking apparatus used preferably in semiconductor device fabrication and more particularly, to a pellet picking method and a pellet picking apparatus for picking up one or more pellets arranged on an adhesive sheet with a collet, where the pellet or pellets is/are usually formed by separation of a wafer through scribing or sawing.

2. Description of the Related Art

Semiconductor pellets are typically formed by cutting or separating a semiconductor wafer with a specific diameter such as 6 or 8 inches into pieces. The pellets are typically rectangular or square. Semiconductor devices and/or elements or semiconductor integrated circuits are formed in the corresponding areas of the wafer to the pellets and therefore, they are formed in each of the pellets. Semiconductor pellets will be often called simply "pellets" hereinafter.

The pellet has a variety of shapes and sizes. For example, the pellet has an approximately square shape of 0.5 mm×0.5 mm to 30 mm×30 mm. The pellet may have an elongated, strap-like shape. The square pellet may be formed by separating the wafer into strap-shaped parts in a step and by separating each of the strap-shaped parts into square pieces in another step.

The above-described separation process of the wafer or its strap-shaped part is typically performed in the following way.

The wafer itself or the strap-shaped part is adhered onto an adhesive sheet and then, it is cut by using an edged tool such as a dicing saw on the sheet, thereby forming the pellets. The sheet is usually stretched or spread on a circular support ring with almost no looseness. In this separation process, the cutting blade of the tool is lowered to penetrate the wafer or the strap-shaped part and then, it is lowered into the sheet to create a trench with about one-third to one-second ($\frac{1}{3}$ to $\frac{1}{2}$) of the thickness of the sheet. The thickness of the sheet is typically approximately 0.1 mm.

Subsequently, the wafer or the strap-shaped part thus formed is mounted on a pellet picking apparatus. At this time, the wafer or the strap-shaped part is kept adhered on the sheet while they are mounted on the apparatus along with the support ring. Then, the apparatus picks up or separates the pellets from the sheet one by one. If the apparatus is built in a die or pellet bonding apparatus, each of the pellets thus separated is bonded to the specific land of a leadframe If the apparatus is not built in a die or pellet bonding apparatus, the pellets thus separated are placed in respective pockets of a tray.

Next, a most popular pellet picking method will be explained with reference to FIGS. 1 and 2 and FIGS. 3A to 3D. In this method, the pellet on the adhesive sheet is pushed up by the needles by way of the sheet, thereby detaching the pellet from the sheet. Then, the pellet thus detached is picked up by the suction collet.

FIGS. 1 and 2 schematically show a prior-art pellet picking apparatus 100, which performs the most popular pellet picking method described above. In FIGS. 1 and 2, an adhesive sheet 101 on which a semiconductor pellet 103 is adhered is also shown. Needless to say, a lot of pellets 103 are adhered onto the sheet 101. However, only one of the pellets 103 is shown for the sake of simplification and facilitation in understanding.

The basic configuration of the prior-art pellet picking apparatus of this type has been already known and therefore, its detailed explanation is omitted here. An example of the basic configuration of the apparatus is disclosed in the Japanese Non-Examined patent publication No. 4-12549 published in 1992. This apparatus is comprised of a wafer table on which an adhesive sheet with a semiconductor wafer (which have been separated into pellets) is placed, an X-Y table for moving horizontally the table along the X and Y directions, a pushing-up needle located under the table and movable vertically by an actuator, a vacuum-suction collet located over the table and movable horizontally and vertically by an actuator, an optically recognition means (e.g., a video camera) for recognizing the position and shape of the pellets on the adhesive sheet, and a controller for controlling the operation of the wafer table, the X-Y table, the needle, the collet, and the optically recognition means. The sheet with the wafer is stretched or spread on a circular support ring. The sheet is placed on the wafer table along with this ring.

The pellets located on the sheet in the form of wafer are placed on the wafer table in such a way that the needle can touch the pellets by way of the opening of the wafer table. Then, the pellets are successively pushed up by the needle while they are held by the collet, thereby detaching successively the pellets from the sheet. Subsequently, the pellets thus detached are successively transported to their specific positions with the collet.

As shown in FIGS. 1 and 2, the prior-art pellet picking apparatus 100 comprises a table 105, one needle 102a and four needles 102b which are arranged to be movable upward and downward in the table 105, and a cylindrical suction collet 104 provided over the table 105.

The table 105 has a hole 106a for accommodating vertically the needle 102a and four holes 106b for individually accommodating vertically the needles 102b. The hole 106a is located at the center of the upper surface 105a of the table 105. The four holes 106b are regularly arranged in the vicinity of the central hole 105a so as to surround the same. The needles 102a and 102b are fixed to a driving mechanism (not shown) for making their vertical motion (which is along the Z-axis).

The collet 104 is fixed to a driving mechanism (not shown) for making its vertical motion (which is along the Z-axis) and its horizontal motion (which is along the X-Y plane). The collet 104 has a suction or absorption end 104a. The collet 104 is located over the table 105 in such a way that the suction or absorption end 104a is opposed to the upper surface 105a of the table 105. The collet 104 is connected to a vacuum generator (not shown), thereby enabling the collet 104 to generate a suction or absorption force at the end 104a.

The prior-art pellet picking apparatus 100 operates in the following way.

First, as shown in FIG. 2, the adhesive sheet 101, on which the pellet 103 has been adhered, is moved horizontally (i.e., along the X-Y plane) while the collet 104 is kept apart from the pellet 103, thereby making positional alignment of the pellet 103 with respect to the table 105. The sheet 101 has been stretched or spread on a circular support ring and is placed on the X-Y stage (not shown) Thus, the sheet 101 is optionally moved along the X-Y plane by driving the X-Y stage for the positional alignment.

If the pellet picking apparatus 100 is applied to the die-or pellet bonding apparatus, the positional alignment of the sheet 101 is realized at high accuracy by visual recognition with a camera or cameras provided over the pellet 103. This is to place the pellet 103 onto the land of a leadframe at high accuracy in the pellet bonding apparatus.

Next, as shown in FIG. 3A, the collet 104 is lowered until the suction end 104a is contacted with the surface of the pellet 103, in which the air in the collet 104 is being exhausted by the vacuum generator to generate a suction force at the end 104a. Thus, the pellet 103 is held by the collet 104 due to the suction force. The state at this stage is shown in FIG. 3A.

Subsequently, as shown in FIG. 3B, the four peripheral needles 102a are moved upward simultaneously to push the peripheral area of the pellet 103 up. At this time, the collet 104 is moved upward to be synchronous with the motion of the pellet 103 without separating the pellet 103. Thus, the adhered area of the periphery of the pellet 103 begins to be detached from the adhesive sheet 101, because the sheet 101 is fixed.

Following this, as shown in FIG. 3C, the peripheral needles 102b are lowered into the holes 106b while the central needle 1012a is elevated. Thus, almost all the adhered area of the pellet 103 is detached from the sheet 101 except for the adhered area near the contact point of the needle 102a.

Finally, as shown in FIG. 3D, the collet 104 is elevated further along with the sucked pellet 103. Thus, the pellet 103 is entirely separated from the sheet 101. The pellet 103 thus separated and held by the collet 104 is moved to a specific position and then, placed on the position by releasing the suction force of the collet 104.

In the above explanation, the pellet 103 is pushed up by the needles 102a and 102b. However, the pellet 103 may be pushed up by only the center needle 102a or by only the peripheral needles 102b.

The above-described method of pushing the pellet 103 up with the needles 102a and/or 102b is referred as the "needle pushing method" in the following explanation.

The above-described needle pushing method has the following problems.

The first problem is that the pellet tends to be damaged. Specifically, since the load is concentrated to the point of the needle, the pellet tends to have flaws or damages such as cracks and chipping. Sometimes, the pellet is cracked or broken. In particular, recently, the thickness of the pellet has been decreasing rapidly. The pellet may be as thin as approximately 0.05 mm. If the pellet is made of a compound semiconductor such as gallium arsenide (GaAs) and indium phosphide (InP) which are more fragile than silicon (Si), the pellet tends to be cracked or broken more easily.

To prevent the flaws or damages of the pellet, the following measures have been developed and taken.

(a) To select an appropriate shape of the point of the needle so as to accord with the size and thickness of the pellet.

(b) To adjust the moving speed and stroke of the needle (e.g., to lower the speed and decrease the stroke).

However, it is difficult for these measures (a) and (b) to solve the above-identified problem that the pellet tends to be damaged.

Additionally, the measure (a) has a disadvantage that the design and formation themselves of the needle having an optimized shape is very difficult and that the needle needs to be replaced with another responsive to the change of the pellet.

Similarly, the measure (b) also has a disadvantage that an optimized condition or adjustment of the needle is very difficult to be realized responsive to the change of the pellet. If the moving speed of the needle is lowered, the damage of the pellet can be avoided. In this case, however, the lowered speed will degrade the productivity.

As explained above, as long as the conventional needle pushing method is used, a lot of replaceable parts are necessary and/or the control of the vertical motion of the needle is complicated in order to avoid the damages of the pellet. This not only raises the fabrication cost of the pellet picking apparatus but also degrades the productivity. Moreover, it is basically difficult to picking the pellet up without any damages.

On the other hand, an improved adhesive sheet, which is termed the "UV adhesive sheet", has ever been developed and used practically. The UV adhesive sheet is a sheet that the adhesive agent coated on the sheet is cured due to irradiation of ultraviolet (UV) light, resulting in the loss of its adhesion.

If the UV adhesive sheet is used for this purpose, UV light is irradiated to the lower face of the sheet prior to detachment of the pellet from the sheet. Since the sheet is translucent for UV light, the irradiated UV light penetrates the sheet, curing the adhesive agent on the upper face of the sheet. Thus, the adhesive agent loses its adhesion and as a result, the pellet is easily separated from the sheet.

However, even if the UV adhesive sheet is used in the conventional needle pushing method, the concentrated load or force applicable to the pellet by the needle is not lowered. Thus, the damage of the pellet cannot be prevented with the use of the UV adhesive sheet.

The second problem of the conventional needle pushing method is that there is a possibility that the pellet fails to be separated from the adhesive sheet, in other words, picking failure occurs. This problem is caused by the following reason.

When the pellet on the adhesive sheet is separated from the sheet by the pushing-up motion of the central needle, the adhering force of the sheet is left at the central area of the pellet with which the sheet is contacted by the point of the needle. Thus, the pellet is unable to be separated from the sheet by the suction force of the collet.

The second problem may occur even if the UV adhesive sheet is used.

Furthermore, there is a method of picking the pellet from the adhesive sheet without using the needle. For example, the adhesive sheet is placed on the stage and sucked downward by way of a hole or holes of the stage, thereby separating the sheet from the pellet. In this case, however, the adhered area of the sheet which is not sucked is unable to be separated from the pellet by the sucking force. As a result, the pellet picking is not ensured.

There is another method of picking the pellet from the adhesive sheet using the needle and the sucking force. For example, the adhesive sheet is placed on the stage and the area corresponding to the periphery of the pellet is sucked downward by way of a hole or holes of the stage and at the same time, the center of the pellet is pushed up by the point of the needle. Thus, the sheet is separated from the pellet. In this case, however, the load by the needle is concentrated to the center of the pellet. Thus, the pellet is not prevented from being damaged.

SUMMARY OF THE INVENTION

Accordingly, an object of the present invention is to provide a pellet picking method and a pellet picking apparatus that prevent the pellet from being damaged during the pellet picking process.

Another object of the present invention is to provide a pellet picking method and a pellet picking apparatus that ensure the picking operation of the pellet without damages.

Still another object of the present invention is to provide a pellet picking method and a pellet picking apparatus that decrease the fabrication cost of the apparatus without lowering the productivity.

The above objects together with others not specifically mentioned will become clear to those skilled in the art from the following description.

According to a first aspect of the present invention, a pellet picking apparatus is provided, which is an apparatus for separating a pellet adhered on an adhesive sheet from the sheet and picking the pellet thus separated.

This apparatus is comprised of:
(a) a stage having a surface with which a lower face of the adhesive sheet is contacted;
  the pellet being adhered on an upper face of the sheet;
  the stage having a suction hole that pulls down the sheet;
  the suction hole having a suction end to be contacted with the sheet on the surface of the stage;
  the stage being movable (capable of translation and rotation) in a horizontal plane with respect to a specific reference position; and
(b) a collet for holding the pellet by a suction force;
  the collet having a suction end to be contacted with the pellet;
  the collet being capable of holding the pellet by the suction force at the suction end;
  wherein when the sheet is placed on the surface of the stage in such a way that the pellet on the sheet is located at the reference position, the collet is controlled to hold the pellet by the suction force at the suction end and at the same time, the stage is controlled to hold the sheet at the suction end of the suction hole and to be moved in the horizontal plane with respect to the reference position to thereby detach the sheet from the pellet;
  and wherein the collet is controlled to pick the pellet thus detached from the sheet.

With the pellet picking apparatus according to the first aspect of the present invention, the stage has a surface with which a lower face of the adhesive sheet is contacted and a suction hole that pulls down the sheet. The suction hole has a suction end to be contacted with the sheet on the surface of the stage. The stage is movable (capable of translation and rotation) in a horizontal plane with respect to a specific reference position.

Moreover, when the adhesive sheet is placed on the surface of the stage in such a way that the pellet on the sheet is located at the reference position, the collet is controlled to hold the pellet by the suction force at the suction end and at the same time, the stage is controlled to hold the sheet at the suction end of the suction hole and to be moved in the horizontal plane with respect to the reference position to thereby detach the sheet from the pellet. The collet is controlled to pick the pellet thus detached from the sheet. Thus, the pellet is separated from the adhesive sheet without using the pushing-up operation of the needles.

As a result, the pellet can be prevented from being damaged during the pellet picking process. This means that the picking operation of the pellet without damages is ensured and that the separation failure of the pellet from the sheet is avoided.

Also, the collet can be formed by a popular, conventional structure and the suction and moving mechanism of the stage can be simplified. Thus, the complicated operation of the needles used in the conventional needle push-up method is unnecessary and at the same time, a lot of needles having various shapes and various sizes need not prepared nor replaced according to the type of the pellet to be picked. Accordingly, the fabrication cost of the apparatus can be lowered drastically, which is enabled without lowering the productivity.

According to a second aspect of the present invention, a pellet picking method is provided, which is a method for separating a pellet adhered on an adhesive sheet from the sheet and picking the pellet thus separated.

This method is comprised of the steps of:
(a) providing a stage having a surface with which a lower face of the adhesive sheet is contacted;
  the pellet being adhered on an upper face of the sheet;
  the stage having a suction hole that pulls down the sheet;
  the suction hole having a suction end to be contacted with the sheet on the surface of the stage;
  the stage being movable (capable of translation and rotation) in a horizontal plane with respect to a specific reference position;
(b) providing a collet for holding the pellet by a suction force;
  the collet having a suction end to be contacted with the pellet;
  the collet being capable of holding the pellet by the suction force at the suction end;
(c) placing the sheet on the surface of the stage in such a way that the pellet on the sheet is located at the reference position;
(d) holding the pellet by the suction force at the suction end of the collet;
(e) holding the sheet at the suction end of the suction hole of the stage;
(f) moving the stage in the horizontal plane with respect to the reference position to thereby detach the sheet from the pellet; and
(g) picking the pellet thus detached from the sheet by the collet.

With the pellet picking method according to the second aspect of the present invention, because of substantially the same reason as the pellet picking apparatus according to the first aspect, the pellet can be prevented from being damaged during the pellet picking process, which means that the picking operation of the pellet without damages is ensured. Also, the fabrication cost of the apparatus can be lowered drastically, which is enabled without lowering the productivity.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
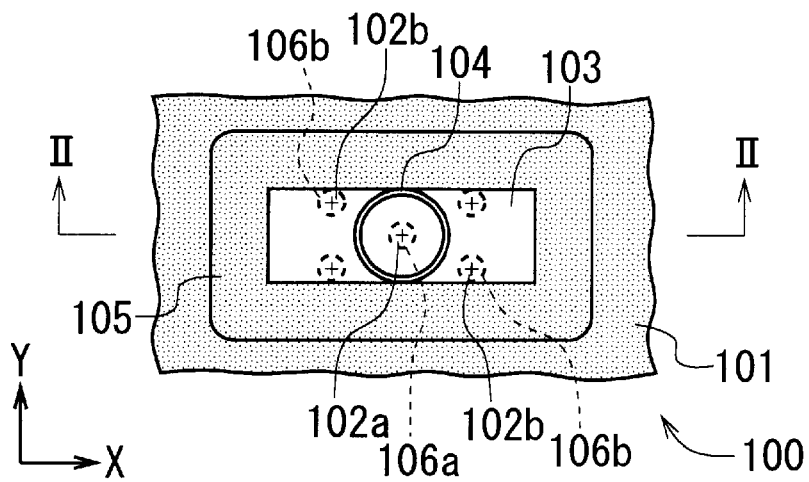
FIG. 1 is a schematic, partial plan view showing the configuration of a prior-art pellet picking apparatus.
Figure 2:
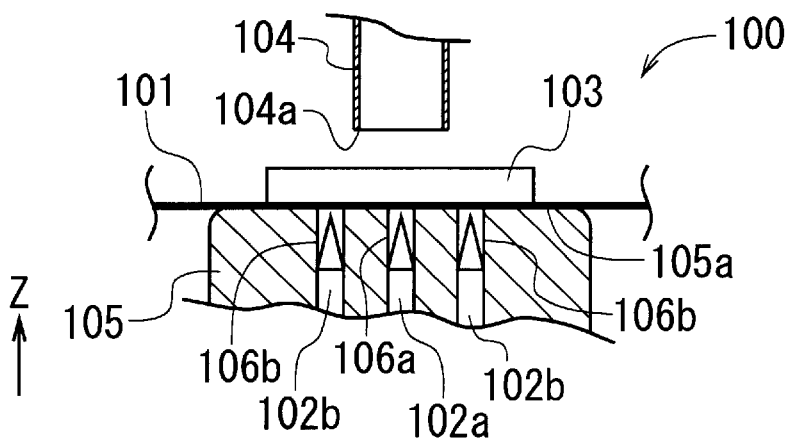
FIG. 2 is a schematic cross-sectional view along the line II—II in FIG. 1.
Figure 3A:
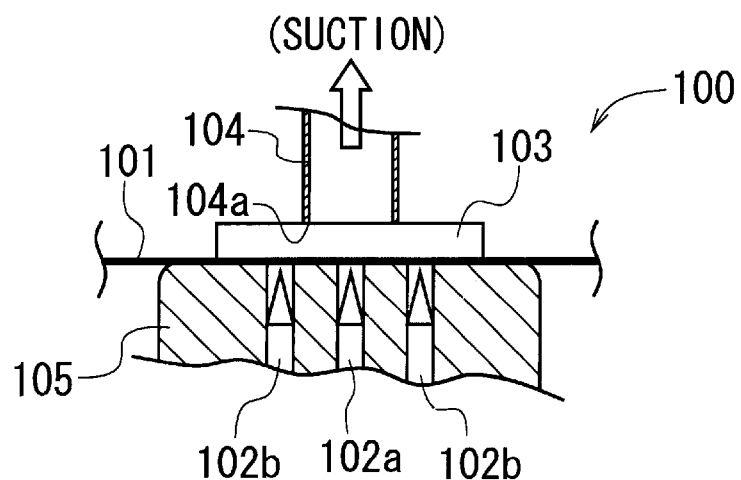
FIGS. 3A to 3D are schematic cross-sectional views along the line II—II in FIG. 1, which show the operation of the prior-art pellet picking apparatus in FIG. 1, respectively.
Figure 3B:
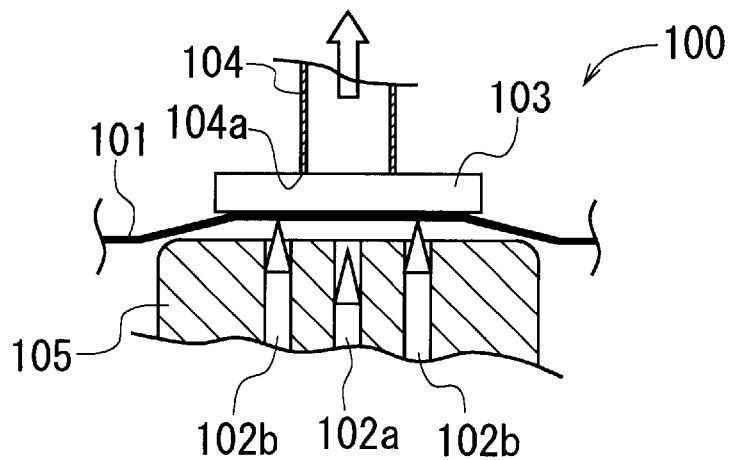
Figure 3C:
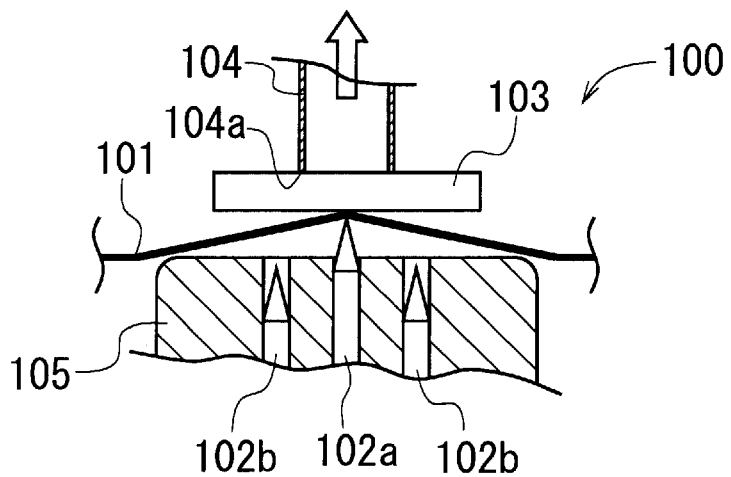
Figure 3D:
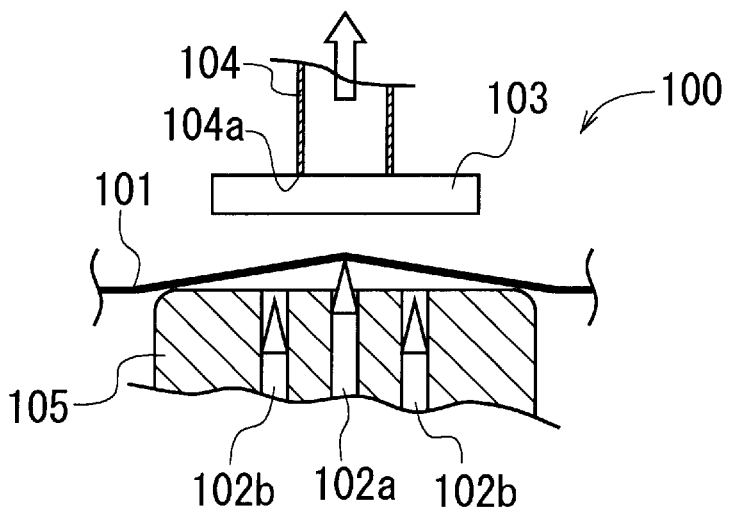

Preferred embodiments of the present invention will be described in detail below while referring to the drawings attached.

First Embodiment

Figure 4:
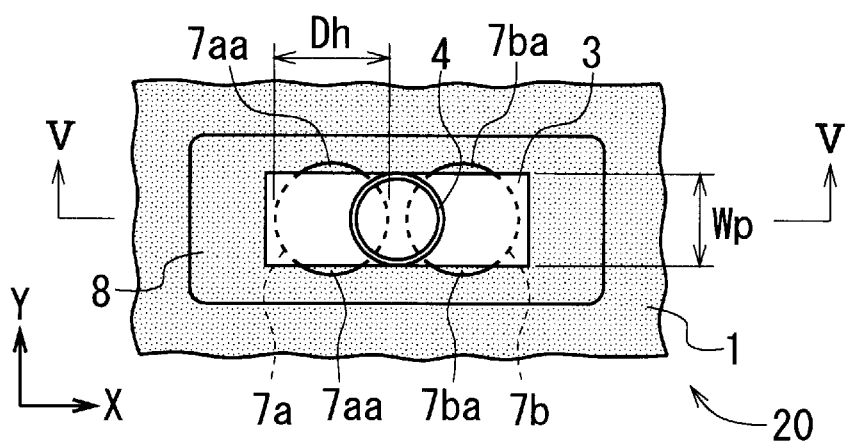
FIG. 4 is a schematic, partial plan view showing the configuration of a pellet picking apparatus according to a first embodiment of the invention.
Figure 5:
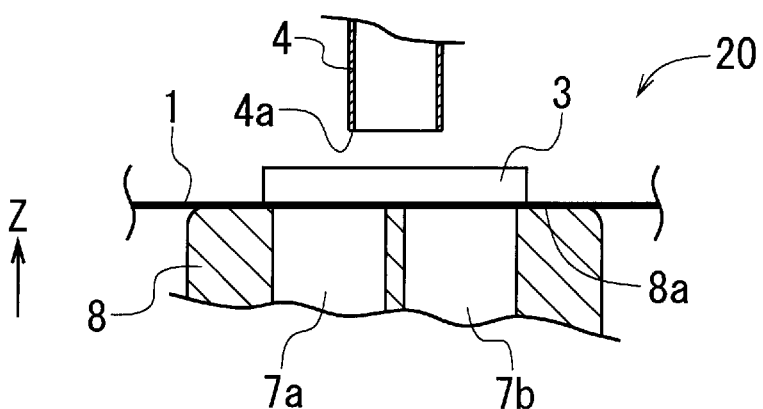
FIG. 5 is a schematic cross-sectional view along the line V—V in FIG. 4.

A pellet picking apparatus 20 according to a first embodiment of the invention shown in FIGS. 4 and 5 is preferably used for semiconductor pellets with a rectangular plan shape.

In FIGS. 4 and 5, an adhesive sheet 1 on which a semiconductor pellet 3 is adhered is also shown. Needless to say, actually, a lot of pellets 3 are adhered onto the sheet 1. However, only one of the pellets 3 is shown for the sake of simplification and facilitation in understanding. This is applicable to other embodiments explained later.

As shown in FIGS. 4 and 5, the pellet picking apparatus 20 according to the first embodiment comprises a stage 8 having two circular suction holes 7a and 7b, and a cylindrical suction collet 4 provided over the stage 8. Unlike the prior-art pellet picking apparatus 100 described above, no needles are provided in the stage 8.

The stage 8 is mounted on a first driving mechanism (not shown) for moving the stage 8 along its longitudinal direction, i.e., along the X-axis in FIG. 4. In other words, the stage 8 is capable of translational movement along the X-axis. The stage 8 has a flat, rectangular surface 8a on its top.

The suction holes 7a and 7b are arranged to be adjacent to each other along the longitudinal direction of the surface 8a of the stage 8. The holes 7a and 7b form circular opening ends in the surface 8a. The holes 7a and 7b are connected to a vacuum generator (not shown) near the bottom of the stage 8, where the vacuum generator serves to generate a suction or absorption force at their top ends.

The top ends of the suction holes 7a and 7b have equal diameters Dh greater then the width Wp of the pellet 3, as shown in FIG. 4, (i.e., Dh>Wp).

The collet 4 is fixed to a second driving mechanism (not shown) for making its vertical motion (which is along the Z-axis) and its horizontal motion (which is along the X-Y plane). The collet 4 has a suction or absorption end 4a. The collet 4 is located over the stage 8 in such a way that the suction or absorption end 4a is opposed to the upper surface 8a of the stage 8. The collet 4 is connected to the same vacuum generator as the stage 8, thereby enabling the collet 4 to generate a suction or absorption force at the end 4a. The structure and operation of the collet 4 is the same as those of the prior-art collet 104 described previously.

The pellet picking apparatus 20 according to the first embodiment operates in the following way.

First, as shown in FIG. 5, the adhesive sheet 1 on which the pellet 3 has been adhered is moved horizontally (i.e., along the X-Y plane) while the collet 4 is kept apart from the pellet 3, thereby making positional alignment of the pellet 3 with respect to the stage 8. The sheet 1 has been stretched or spread on a circular support ring (not shown) and is placed on the X-Y stage (not shown). Thus, the sheet 1 is optionally moved along the X-Y plane by driving the X-Y stage for the positional alignment.

The position of the pellet 3 at which the positional alignment is made (as shown in FIGS. 4 and 5) is termed the "initial position" or the "reference position" hereinafter.

To facilitate the separation of the pellet 3 from the sheet 1, a UV adhesive sheet is preferably used as the sheet 1. In this case, it is preferred that UV light is irradiated to the sheet 1 from its back or lower side before the sheet 1 is placed on the X-Y stage along with the support ring.

After the positional alignment of the sheet 1 is completed, parts 7aa and 7ba of the suction holes 7a and 7b are positioned outside the pellet 3, as shown in FIG. 4. This is due to the fact that the diameter Dh of the top ends (i.e., the suction ends) of the holes 7a and 7b is set to be greater than the width Wp of the pellet 3.

Figure 6A:
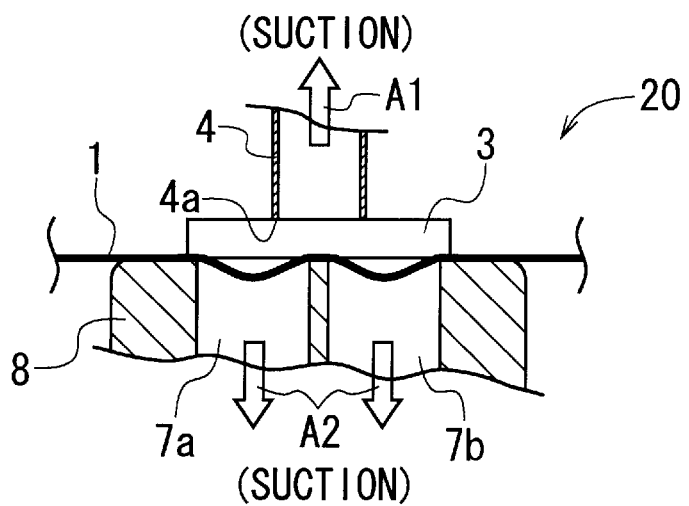
FIGS. 6A to 6D are schematic cross-sectional views along the line V—V in FIG. 4, which show the operation of the pellet picking apparatus according to the first embodiment in FIG. 4, respectively.

Next, as shown in FIG. 6A, the collet 4 is lowered until the suction end 4a is contacted with the surface of the pellet 3, in which the air existing in the collet 4 is exhausted by the vacuum generator along the arrow A1 to generate a suction force at the end 4a. Thus, the pellet 3 is held by the collet 4 due to the suction force. On the other hand, the vacuum generator exhausts simultaneously the air existing in the holes 7a and 7b of the stage 8 along the arrow A2 and therefore, a suction force is generated at the top ends of the holes 7a and 7b. Thus, the sheet 1 is sucked downward into the holes 7a and 7b and is partially detached from the pellet 3, as shown in FIG. 6A. This is due to the following reason.

As explained above, the diameter Dh of the suction ends of the holes 7a and 7b is set to be greater than the width Wp of the pellet 3 and thus, the parts 7aa and 7ba of the holes 7a and 7b are positioned outside the pellet 3. When the sheet 1 in this state is sucked downward into the holes 7a and 7b, small gaps are formed between the sheet 1 and the parts 7aa and 7ba. These gaps allow the air to flow into the holes 7a and 7b and at the same time, the sheet 1 is partially pulled down into the holes 7a and 7b. The state at this stage is shown in FIG. 6A.

If the diameter Dh of the suction ends of the holes 7a and 7b is set to be less than the width Wp of the pellet 3 (for example, Dh is approximately equal to half of Wp), the suction ends of the holes 7a and 7b are entirely placed under the pellet 1. In this case, even if the sheet 1 is sucked downward by way of the holes 7a and 7b, no gaps are formed between the sheet 1 and the parts 7aa and 7ba. As a result, the trigger for separation of the sheet 1 from the pellet 3 is not generated.

Figure 7A:
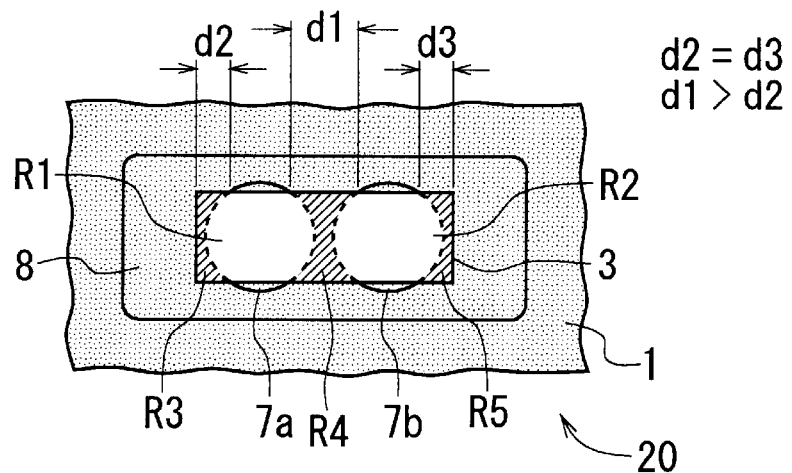
FIGS. 7A to 7E are schematic, partial plan views showing the operation of the pellet picking apparatus according to the first second embodiment in FIG. 4, respectively.

In the state of FIG. 6A, as shown in FIG. 7A, the sheet 1 is detached from the pellet 3 only in the overlapped areas R1 and R2 between the pellet 3 and the holes 7a and 7b. The sheet 1 is not detached from the pellet 3 in the unoverlapped regions R3, R4 and R5 between the pellet 3 and the holes 7a and 7b. The unoverlapped regions R3, R4 and R5 are specified by slashes in FIG. 6A.

Figure 6B:
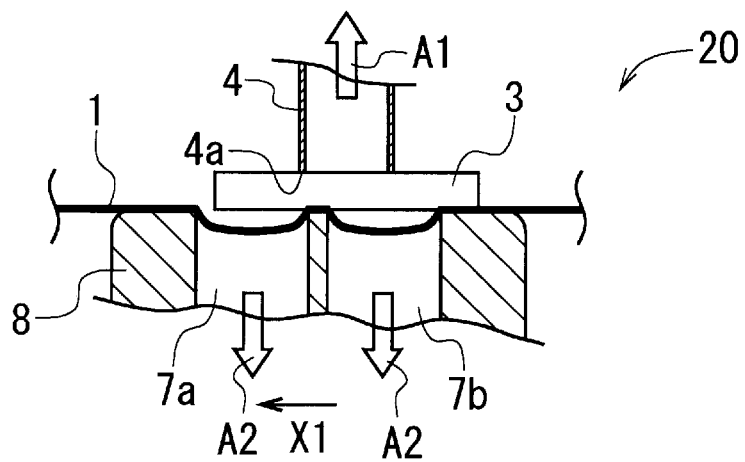

Subsequently, as shown in FIG. 6B, the stage 8 is moved horizontally to the left-hand side along the arrow X1 by the first driving mechanism while the pellet 3 is fixed at its initial position by the collet 4. Since the sheet 1 has been partially separated from the pellet 3, the separated region of the sheet 1 expands due to this motion of the stage 8 with the sheet 1 being sucked.

Figure 7B:
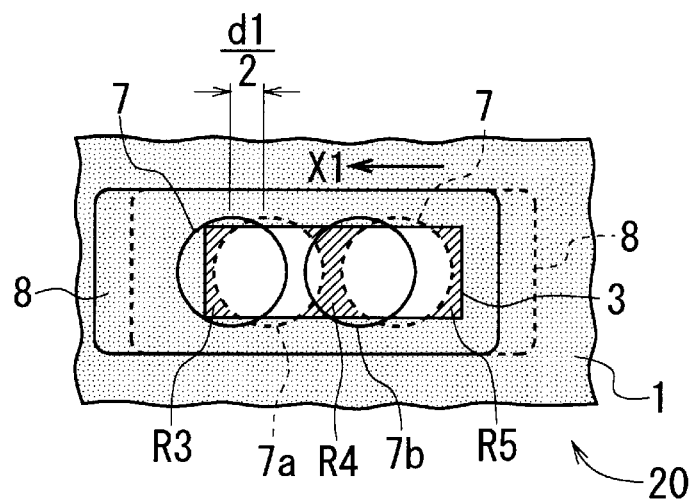
Figure 7C:
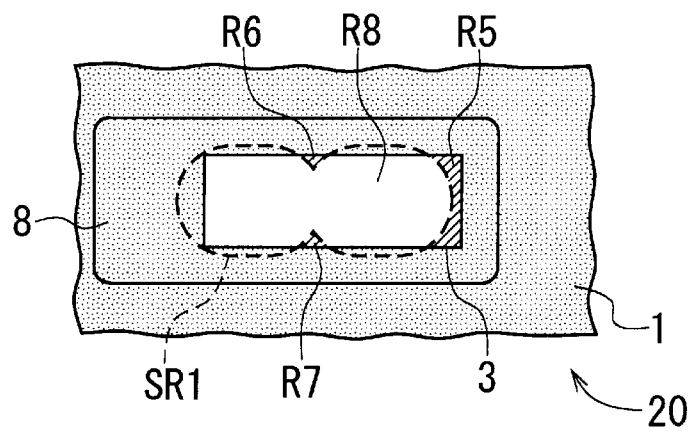

Here, the positional relationship between the holes 7a and 7b and the pellet 3 is expressed as d2=d3 and d1>d2 (or d3), where d1, d2, and d3 are the maximum lengths of the unoverlapped regions R3, R4, and R5 shown in FIG. 7A along the moving direction, respectively. Therefore, the moving distance of the stage 8 is set as a half of d1, i.e., (d½), in the step of moving the stage 8 to the left-hand side in FIG. 6B. In this step, as shown in FIG. 7B, the hole 7a is overlapped with the region R3 and at the same time, the hole 7b is overlapped with the region R4. As a result, as shown in FIG. 7C, the sheet 1 is sucked in the expanded region SR1 and separated from the pellet 3 in the expanded region R8, thereby increasing the separated area of the sheet 1. In FIG. 7C, the sheet 1 is left adhered to the pellet 3 in the regions R5, R6, and R7.

Figure 6C:
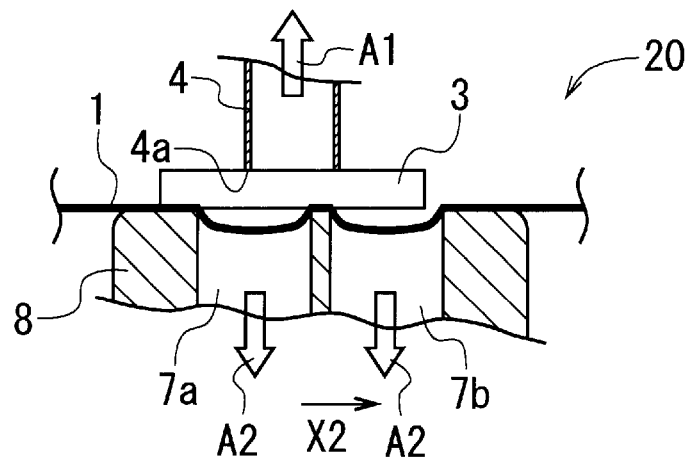
Figure 7D:
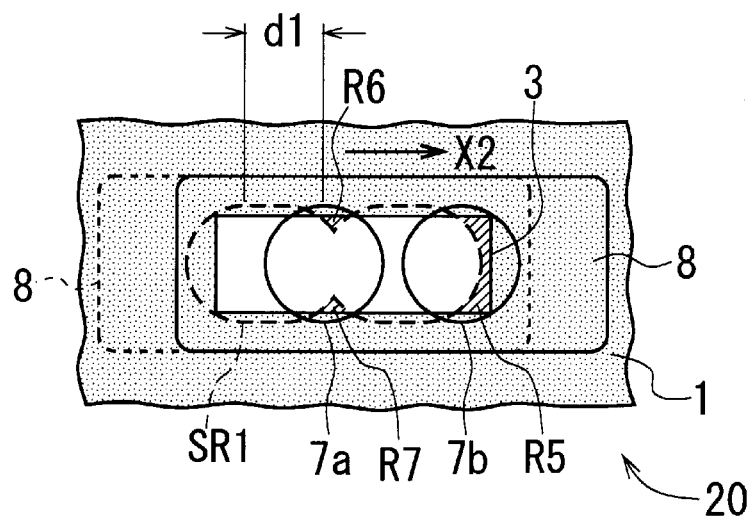
Figure 7E:
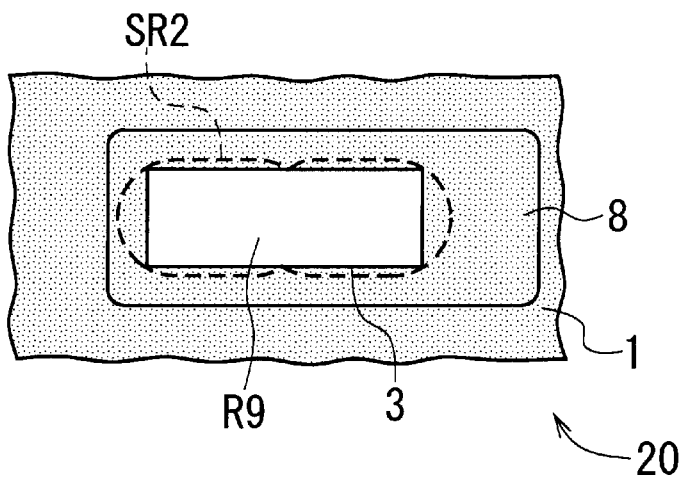

Furthermore, as shown in FIG. 6C, the state 8 is moved horizontally to the right-hand side along the arrow X2 by the first driving mechanism while the pellet 3 is fixed at its initial position by the collet 4. In this step of moving the stage 8 to the right-hand side, the moving distance of the stage 8 is set as d1. In this step, as shown in FIG. 7D, the hole 7a is overlapped with the unovelapped regions R5 and R6 and at the same time, the hole 7b is overlapped with the unovelapped region R7. As a result, as shown in FIG. 7E, the sheet 1 is sucked in the expanded region SR2 and separated from the pellet 3 in the region R9, thereby completing the separation of the sheet 1 from the pellet 3. The region R9 is equal to the whole bottom face of the pellet 3. In FIG. 7E, the sheet 1 is entirely apart from the pellet 3.

Figure 6D:
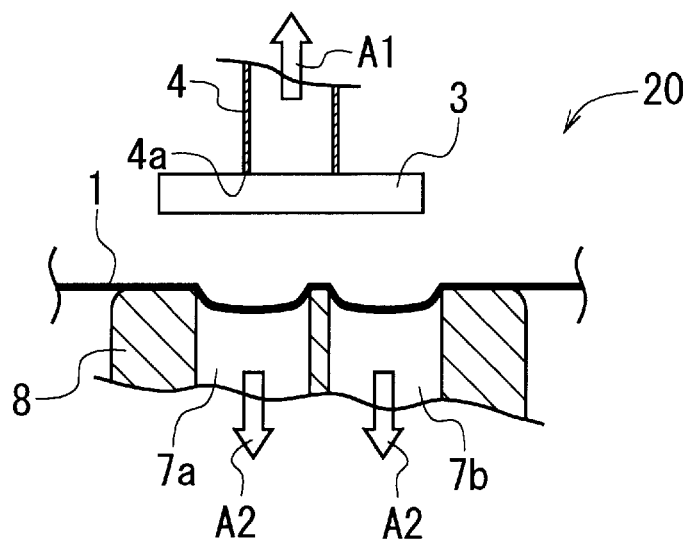

Finally, the collet 4 is elevated along with the pellet 3. In this stage, the sheet 1 has been entirely apart from the pellet 3 and thus, the pellet 3 is moved upward along with the collet 4, as shown in FIG. 6D. Then, the collet 4 and the pellet 3 are translated or rotated in a horizontal plane (i.e., the X-Y plane) to transport the pellet 3 to a desired position. The pellet thus transported is placed on the desired position by stopping the suction operation of the collet 4.

To separate the next pellet 3 from the adhesive sheet 1 and transport the same to its desired position, the collet 4 is returned to its initial position shown in FIGS. 4 and 5.

With the pellet picking apparatus 20 according to the first embodiment, as described above, the collet 4 holds the pellet 3 by the sucking operation and at the same time, the sheet 1 is sucked by way of the suction holes 7a and 7b of the stage 8, thereby separating the sheet 1 from the pellet 3 in the overlapped regions R1 and R2 (FIG. 6A). Then, the stage 8 is moved to the left-hand side and the right-hand side along the X-axis while the sucking operations for the pellet 3 and for the sheet 1 are kept unchanged, thereby separating the sheet 1 from the pellet 3 entirely.

Accordingly, the pushing-up operation of the pellet 3 by the needles is unnecessary and as a result, the pellet 3 is surely prevented from being damaged during the pellet picking process. This means that the picking operation of the pellet 3 without damages is ensured and that the separation failure of the pellet 3 from the sheet 1 is avoided.

Also, the collet 4 can be formed by a popular, conventional structure and the suction and moving mechanism of the stage 8 can be simplified. Thus, the complicated operation of the needles used in the conventional needle push-up method is unnecessary and at the same time, a lot of needles having various shapes and various sizes need not prepared nor replaced according to the type of the pellet 3 to be picked. Accordingly, the fabrication cost of the apparatus 20 can be lowered drastically, which is enabled without lowering the productivity.

Next, the size and arrangement of the pellet 3 and the suction holes 7a and 7b will be explained.

In the pellet picking apparatus 20 according to the first embodiment, the two suction holes 7a and 7b are formed in the stage 8 and have equal diameter Dh slightly larger than the width (i.e., the length of the shorter sides) Wp of the pellet 3. Also, when the sheet 1 is sucked downward by way of the holes 7a and 7b, the central part and the two end parts of the pellet 3 are supported by the surface 8a of the stage 8.

Figure 8A:
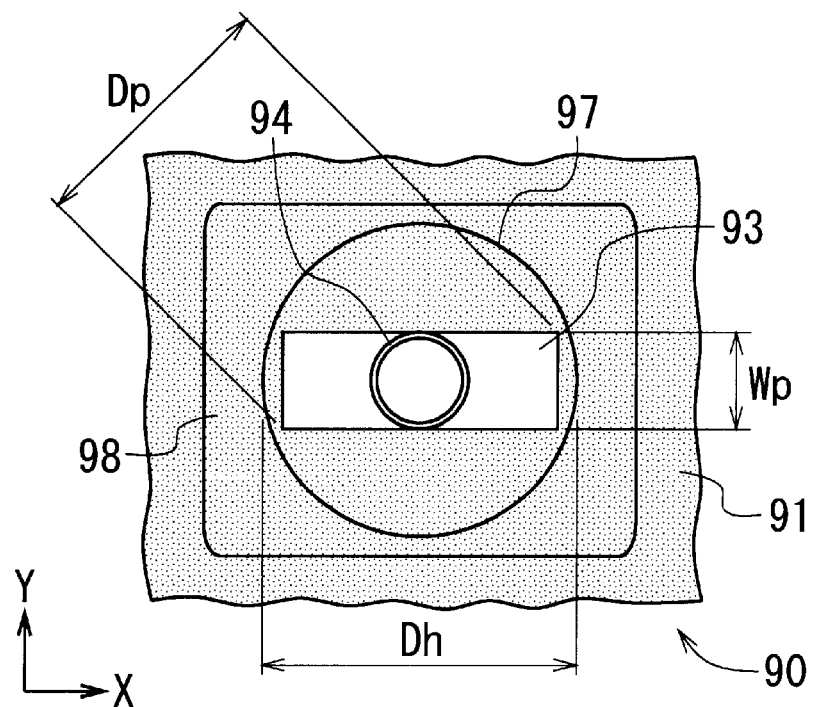
FIG. 8A is a schematic, partial plan view showing a comparative example of the pellet picking apparatus according to the first embodiment in FIG. 4.

FIG. 8A shows a pellet picking apparatus 90, which is a comparative example of the apparatus 20 according to the first embodiment. The apparatus 90 comprises a stage 98 having a single suction hole 97. The hole 97 has a circular top end located at the center of the surface of the stage 98. The end of the hole 97 has a diameter Dh greater than the diagonal length Dp of the pellet 93.

With the pellet picking apparatus 90 shown in FIG. 8A, the entire bottom face of the pellet 93 is included in the top end (i.e., the suction end) of the hole 97 and therefore, the trigger for detaching the sheet 91 from the pellet 93 is not effectively formed even if the sheet 91 is sucked downward by way of the hole 97. As a result, even if the stage 98 is moved horizontally along the X-axis in the same way as explained above in the apparatus 20 according to the first embodiment, the pellet 93 is unable to be separated from the pellet 93 entirely.

As seen from the explanation about the apparatus 90 as the comparative example, in the apparatus 20 of the first embodiment also, the size and layout of the suction holes 7a and 7b need to be considered with respect to the size and shape of the pellet 3 in such a way that a trigger for detaching the sheet 1 from the pellet 3 is surely formed in the pellet picking process. At the same time as this, considering the sheet 1 has a typical thickness of approximately 0.1 mm, the diameter Dh of the holes 7a and 7b is necessarily determined to ensure that the corresponding parts of the sheet 1 to the holes 7a and 7b are easily pulled down into the holes 7a and 7b by the suction force.

The moving distance of the stage 8 with respect to the reference or initial point of the collet 4 needs to be determined in such a way that the pellet 3 is entirely detached or separated from the sheet 1 after the specified movement of the stage 8 is completed. If a narrow attached area of the sheet 1 to the pellet 3 is left even after the specified movement of the stage 8 is completed, it is not certain for the collet 4 to pick the pellet 3 up from the sheet 1, thereby inducing the failure of separation of the pellet 3. Accordingly, the minimum moving distance of the stage 8 should be determined while the size, shape, and layout of the holes 7a and 7b and the size and shape of the pellet 3 are taken into consideration.

Figure 8B:
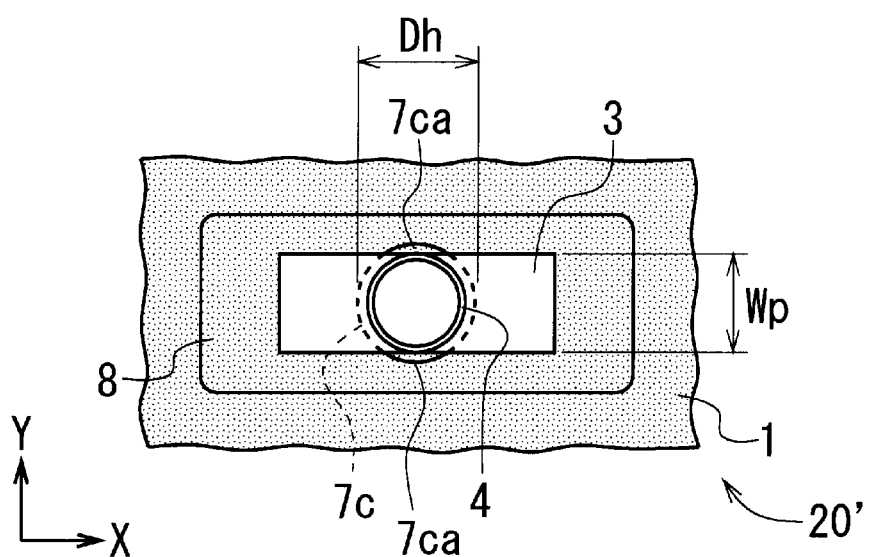
FIG. 8B is a schematic, partial plan view showing a variation of the pellet picking apparatus according to the first embodiment in FIG. 4.

FIG. 8B shows a pellet picking apparatus 20', which is a variation of the pellet picking apparatus 20 according to the first embodiment.

The pellet picking apparatus 20' has the same configuration as the apparatus 20 according to the first embodiment, except that the stage 8 has a single suction hole 7c. Thus, the explanation about the same configuration is omitted here by attaching the same reference symbols as those for the apparatus 20 in FIG. 8B.

In the apparatus 20' shown in FIG. 8B, the suction hole 7c has a circular top end located at the center of the surface of the stage 8. The end of the hole 7c has a diameter Dh equal to that of the holes 7a and 7b in the apparatus 20 of the first embodiment. Unlike the apparatus 90 as the comparative example shown in FIG. 8A, the parts 7ca of the hole 7c are located outside the pellet 3 when the sheet 1 is placed on the stage 8 along with the pellet 3, as shown in FIG. 8B. Thus, like the apparatus 20 of the first embodiment, a trigger to detach the sheet 1 from the pellet 3 can be formed.

Also in this apparatus 20' of FIG. 8B as the variation of the apparatus 20, the moving distance of the stage 8 should be determined in such a way that the pellet 3 is entirely detached or separated from the sheet 1 after the specified movement of the stage 8 is completed. This means that there is a disadvantage that the moving distance of the stage 8 in the apparatus 20' is larger than that in the apparatus 20 of the first embodiment.

Second Embodiment

Figure 9:
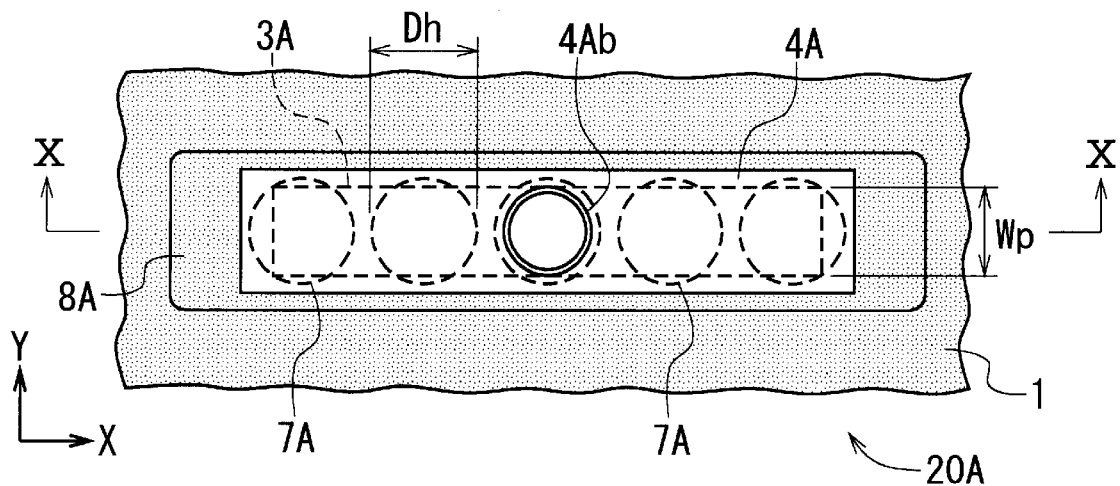
FIG. 9 is a schematic, partial plan view showing the configuration of a pellet picking apparatus according to a second embodiment of the invention.
Figure 10:
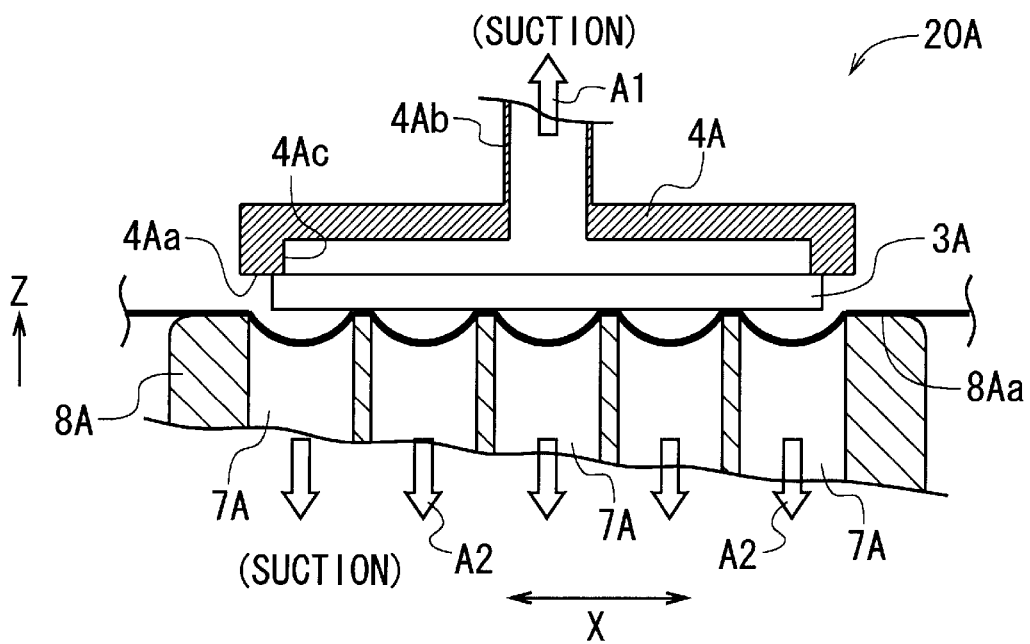
FIG. 10 is a schematic cross-sectional view along the line IX—IX in FIG. 9.

FIGS. 9 and 10 show a pellet picking apparatus 20A according to a second embodiment of the invention, which is preferably used for semiconductor pellets with an elongated plan shape (e.g., strap-shaped pellets).

As shown in FIGS. 9 and 10, the apparatus 20A comprises a stage 8A having five suction holes 7A and a cylindrical suction collet 4A provided over the stage 8A. The stage 8A is mounted on a first driving mechanism (not shown) for moving the stage 8A along its longitudinal direction, i.e., along the X-axis in FIGS. 9 and 10. The stage 8A has a flat, rectangular surface 8Aa on its top.

The suction holes 7A are arranged to be adjacent to each other along the longitudinal direction of the surface 8Aa of the stage 8A. The holes 7A form circular opening ends in the surface 8Aa. The holes 7A are connected to a vacuum generator (not shown) near the bottom of the stage 8A, where the vacuum generator serves to generate a suction or absorption force at their top ends. The top ends of the suction holes 7A have equal diameters Dh greater then the width Wp of the pellet 3A, i.e., Dh>Wp, as shown in FIG. 9.

The collet 4A is fixed to a second driving mechanism (not shown) for making its vertical motion (which is along the Z-axis) and its horizontal motion (which is along the X-Y plane). The collet 4A has a rectangular, flat suction or absorption end 4Aa that holds the top surface of the pellet 3A. The collet 4A has a rectangular suction hole 4Ac at the end 4Aa and a cylindrical tube 4Ab communicated with the hole 4Ac. The tube 4Ab is located at the middle of the hole 4Ac. The collet 4A is located over the stage 8A in such a way that the suction or absorption end 4Aa is opposed to the upper surface 8Aa of the stage 8A. The collet 4A is connected to the same vacuum generator as the stage 8A, thereby enabling the collet 4A to generate a suction or absorption force at the end 4Aa. The structure and operation of the collet 4A is the same as those of the prior-art collet 104 described previously.

When the collet 4A is contacted with the pellet 3A to hold the same by a sucking force, the rectangular suction hole 4Ac of the collet 4A is aligned to the rectangular pellet 3A in such a way that all the holes 7A are entirely overlapped with the pellet 3A. In other words, none of the holes 7A is located outside the top surface of the pellet 3A in this state, as shown in FIG. 9. Thus, no air leakage occurs between the hole 4Ac of the collet 4A and the top surface of the pellet 3A.

The pellet picking apparatus 20A according to the second embodiment operates in approximately the same way as the apparatus 20 according to the first embodiment.

Specifically, first, the adhesive sheet 1 on which the pellet 3A has been adhered is moved horizontally (i.e., along the X-Y plane) while the collet 4A is apart from the pellet 3A, thereby making positional alignment of the pellet 3A with respect to the stage 8A. FIG. 9 shows the state after the positional alignment of the sheet 1 is completed, in which parts of the suction holes 7A are positioned outside the pellet 3A. This is due to the fact that the diameter Dh of the top ends of the holes 7A is greater than the width Wp of the pellet 3A.

Next, as shown in FIG. 10, the vacuum generator exhausts the air existing in the collet 4A along the arrow A1, generating a suction force at the end 4Aa. Thus, the pellet 3A is held by the collet 4A due to the suction force. On the other hand, the vacuum generator exhausts simultaneously the air existing in the holes 7A of the stage 8A along the arrow A2 and therefore, a suction force is generated at the top ends of the holes 7A. Thus, the sheet 1 is sucked downward into the holes 7A and is partially separated from the pellet 3A, as shown in FIG. 10.

Subsequently, the stage 8A is moved horizontally to the left- and right-hand sides along the arrow X by the first driving mechanism while the pellet 3A is fixed at its initial position by the collet 4A. Since the sheet 1 has been partially separated from the pellet 3A, the sheet 1 is entirely detached from the pellet 3A due to the movement of the stage 8A.

Finally, the collet 4A is elevated along the Z-axis. In this stage, the sheet 1 has been entirely apart from the pellet 3A and thus, the pellet 3A is moved upward along with the collet 4A. The following steps are the same as those in the first embodiment.

With the pellet picking apparatus 20A according to the second embodiment, because of the same reason as explained in the first embodiment, the pellet 3A is surely prevented from being damaged during the pellet picking process. This means that the picking operation of the pellet 3A without damages is ensured and that the separation failure of the pellet 3A from the sheet 1 is avoided. Also, the fabrication cost of the apparatus 20A can be lowered drastically, which is enabled without lowering the productivity.

To confirm the advantage of the invention, the inventor actually fabricated the pellet picking apparatus 20A according to the second embodiment and then, conducted the pellet-picking test using fragile compound semiconductor pellets (e.g., GaAs or InP) These pellets were thin, rectangular pellets (0.5 mm in width, 13 mm in length, and 0.085 mm in thickness). As a result, in spite of the fact that the pellets used were fragile and thin and difficult to be dealt with, it was confirmed that the pellets were picked up from the adhesive sheet without any damage.

Third Embodiment

Figure 11:
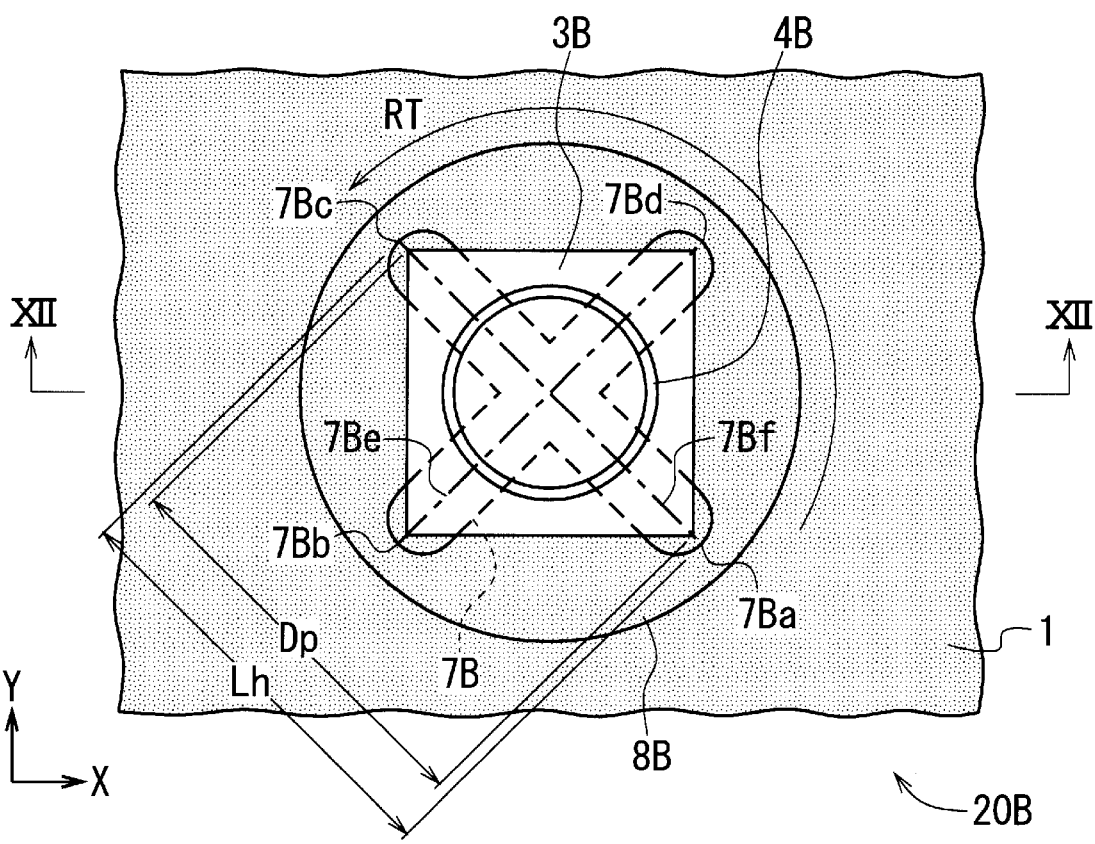
FIG. 11 is a schematic, partial plan view showing the configuration of a pellet picking apparatus according to a third embodiment of the invention.
Figure 12:
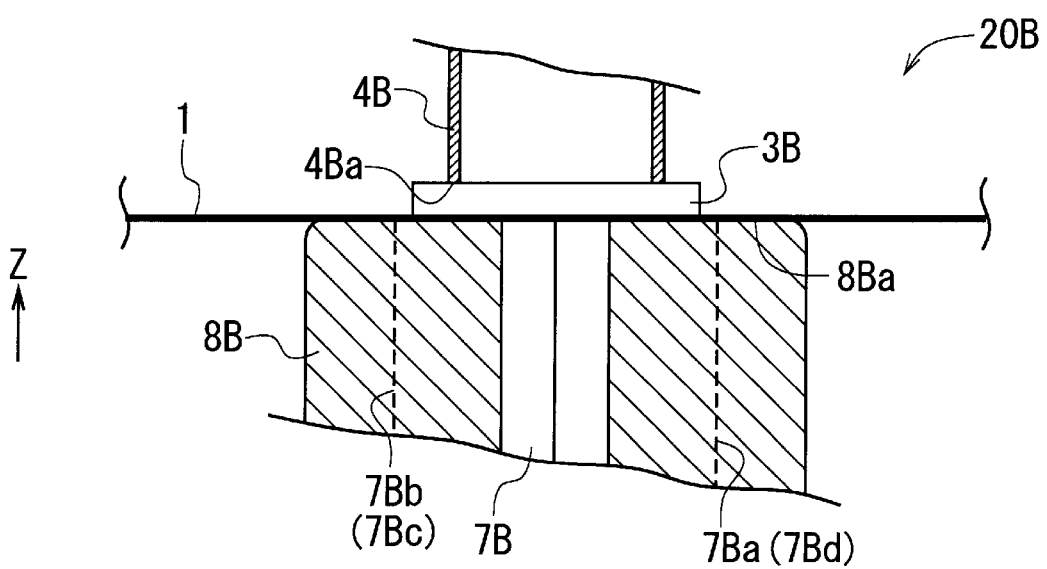
FIG. 12 is a schematic cross-sectional view along the line XII—XII in FIG. 11.

FIGS. 11 and 12 show a pellet picking apparatus 20B according to a third embodiment of the invention.

In the above-described apparatuses 20 and 20A according to the first and second embodiments, the stage 8 or 8A is movable horizontally along the longitudinal axis of the elongated pellet 3 and 3A. Unlike this, in the apparatus 20B according to the third embodiment, a stage C is rotatable in a horizontal plane (i.e., along the X-Y plane) around the vertical axis (not shown). Thus, the apparatus 20B is preferably used for semiconductor pellets with an approximately square plan shape.

As shown in FIGS. 11 and 12, the apparatus 20B comprises a cylindrical stage 8B having a suction hole 7B and a cylindrical suction collet 4B provided over the stage 8B. The stage 8B is mounted on a first driving mechanism (not shown) for moving the stage 8B along its longitudinal direction, i.e., along the X-axis in FIG. 11. The stage 8B has a flat, rectangular surface 8Ba on its top.

The suction hole 7B has a cross-section like an "X" character, as clearly seen from FIG. 11. In other words, the suction end of the hole 7B located at its top is X-shaped. It is said that the suction end of the hole 7B is formed to extend its two axes 7Be and 7Bf intersected each other at a right angle. The length Lh of the suction end of the hole 7B along the axis 7Be or 7Bf is greater than the diagonal length Dp of the pellet 3B (i.e., Lh>Dp). Thus, when the two diagonal lines of the pellet 3B are entirely overlapped with the two axes 7Be and 7Bf of the hole 7B, respectively, as shown in FIG. 11, the four outer ends of the suction end of the hole 7B are located outside the pellet 3B.

The center of the hole 7B is aligned with the center of the surface 8Ba of stage 8B. The hole 7B is connected to a vacuum generator (not shown) near the bottom of the stage 8B, where the vacuum generator serves to generate a suction or absorption force at its top end.

The collet 4B is fixed to the second driving mechanism (not shown) for making its vertical motion (which is along the Z-axis) and its horizontal motion (which is along the X-Y plane). The collet 4B has a circular, flat suction end 4Ba that holds the top surface of the pellet 3B. The collet 4B is located over the stage 8B in such a way that the suction end 4Ba is opposed to the upper surface 8Ba of the stage 8A. The collet 4B is connected to the same vacuum generator as the stage 8B, thereby enabling the collet 4B to generate a suction or absorption force at the end 4Ba.

The pellet picking apparatus 20B according to the third embodiment operates in the following way.

First, as shown in FIG. 11, the adhesive sheet 1 with the pellet 3B is aligned to a specific initial or reference position, at which the center of the pellet 3B is overlapped with the center of the surface 8Ba of the stage 8B.

Next, the collet 4B is lowered until the suction end 4Ba is contacted with the surface of the pellet 3B and the vacuum generator exhausts the air existing in the collet 4B to generate a suction force at the end 4Ba. Thus, the pellet 3B is held by the collet 4B due to the suction force. At this time, the two diagonal lines of the pellet 3B are entirely overlapped with the two axes 7Be and 7Bf of the hole 7B, respectively, as shown in FIG. 11. The four outer ends of the suction end of the hole 7B are located outside the pellet 3B. The outer ends thus located outside are referred as the regions 7Ba, 7Bb, 7Bc, and 7Bd.

On the other hand, the vacuum generator exhausts simultaneously the air existing in the hole 7B of the stage 8B, generating a suction force at the top end of the hole 7B. Thus, the sheet 1 is sucked downward into the X-shaped hole 7B and small gaps are formed between the unovelapped regions 7Ba, 7Bb, 7Bc, and 7Bd and the pellet 3B, partially detaching the sheet 1 from the pellet 3B. Thus, the overlapped regions of the sheet 1 with the X-shaped suction end of the hole 7B are partially separated from the pellet 3.

Thereafter, as shown in FIG. 11, the stage 8B is rotated around its central axis in the X-y plane along the arrow RT while the pellet 3B is held by the collet 4B by the suction force. As a result, the sheet 1 is entirely separated from the pellet 3B.

With the pellet picking apparatus 20B according to the third embodiment, because of the same reason as explained in the first embodiment, the pellet 3B is surely prevented from being damaged during the pellet picking process. This means that the picking operation of the pellet 3B without damages is ensured and that the separation failure of the pellet 3B from the sheet 1 is avoided. Also, the fabrication cost of the apparatus 20B can be lowered drastically, which is enabled without lowering the productivity.

Figure 13:
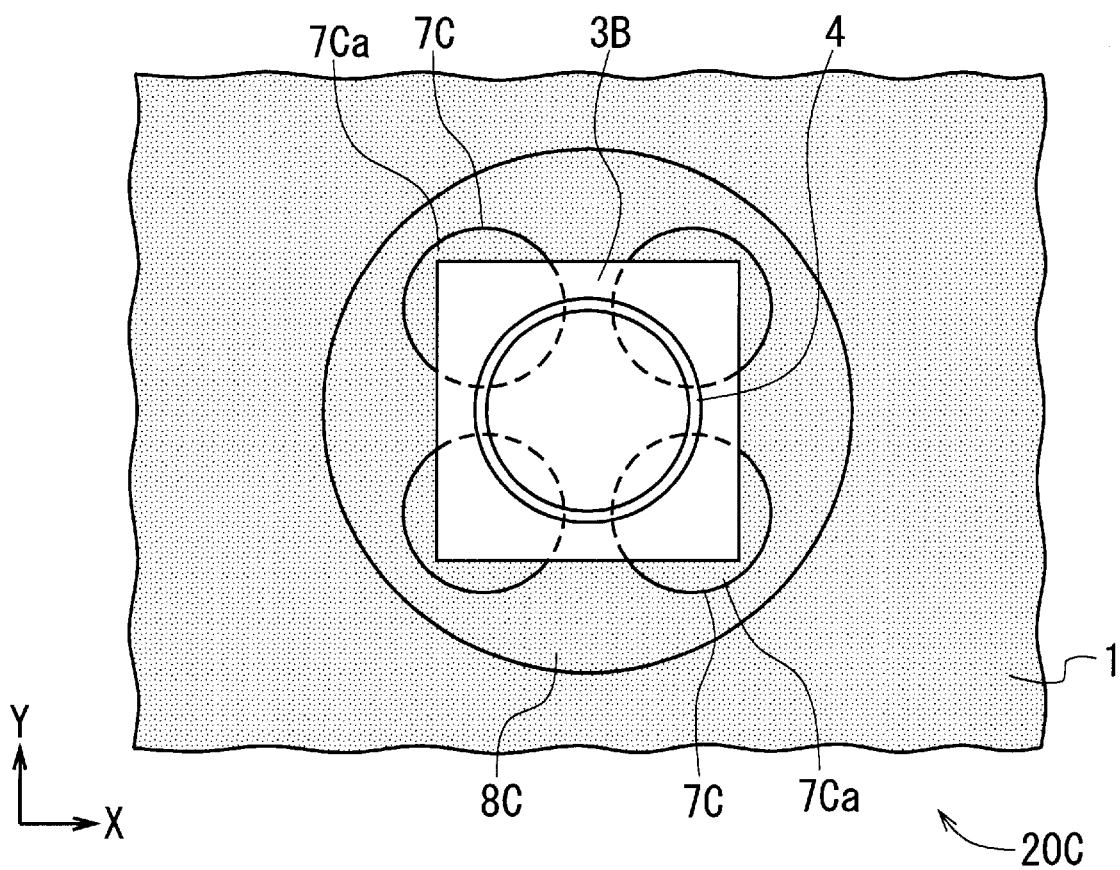
FIG. 13 is a schematic, partial plan view showing a comparative example of a pellet picking apparatus according to the third embodiment in FIG. 11.

FIG. 13 shows a pellet picking apparatus 20C as a variation of the pellet picking apparatus 20B according to the third embodiment, in which a stage 8C is not rotated. This apparatus 20C is applicable to pellets that are approximately square in plan shape, small, and fragile, which is similar to the apparatus 20B according to the third embodiment.

The apparatus 20C comprises the stage 8C having four circular suction holes 7C. The holes 7C have circular suction ends at their tops. The diameter of the location of the holes 7C are determined in such a way that the parts 7Ca of the holes 7C are outside the pellet 3B when the four corners of the pellet 3B are individually located to overlap with the four holes 7C, as shown in FIG. 13.

The pellet picking apparatus 20C operates in the following way.

Specifically, first, the pellet 3B on the adhesive sheet 1 is placed on the stage 8C so as to be aligned with the suction holes 7C, as shown in FIG. 13. In this stage, the parts 7Ca of the holes 7C are outside the pellet 3B. Next, the sheet 1 is sucked downward by way of the holes 7C while the pellet 3B is held by the collet 4C. Thus, the sheet 1 is sucked down into the holes 7C and is partially separated from the pellet 3B.

Subsequently, the stage 8C is moved horizontally along the X-axis and then, moved along the Y-axis. Since the sheet 1 has been partially separated from the pellet 3B, the sheet 1 is entirely detached from the pellet 3B due to the translational movement of the stage 8C.

With the apparatus 20C, the stage 8C needs to be moved along both the X- and Y-axes and therefore, there is a disadvantage that it takes more time to separate entirely the pellet 3B from the sheet 1 than the apparatus 20B according to the third embodiment. There is another disadvantage that the moving mechanism of the stage 8C it complicated and the fabrication cost is higher compared with the apparatus 20B according to the third embodiment.

Fourth to seventh embodiments of the invention will be described below. These embodiments include several contrivances to make sure that the pellet is separated from the adhesive sheet. These embodiments are configured to take the picking procedure of the pellets arranged in a matrix array on the sheet into consideration.

Fourth Embodiment

Figure 14:
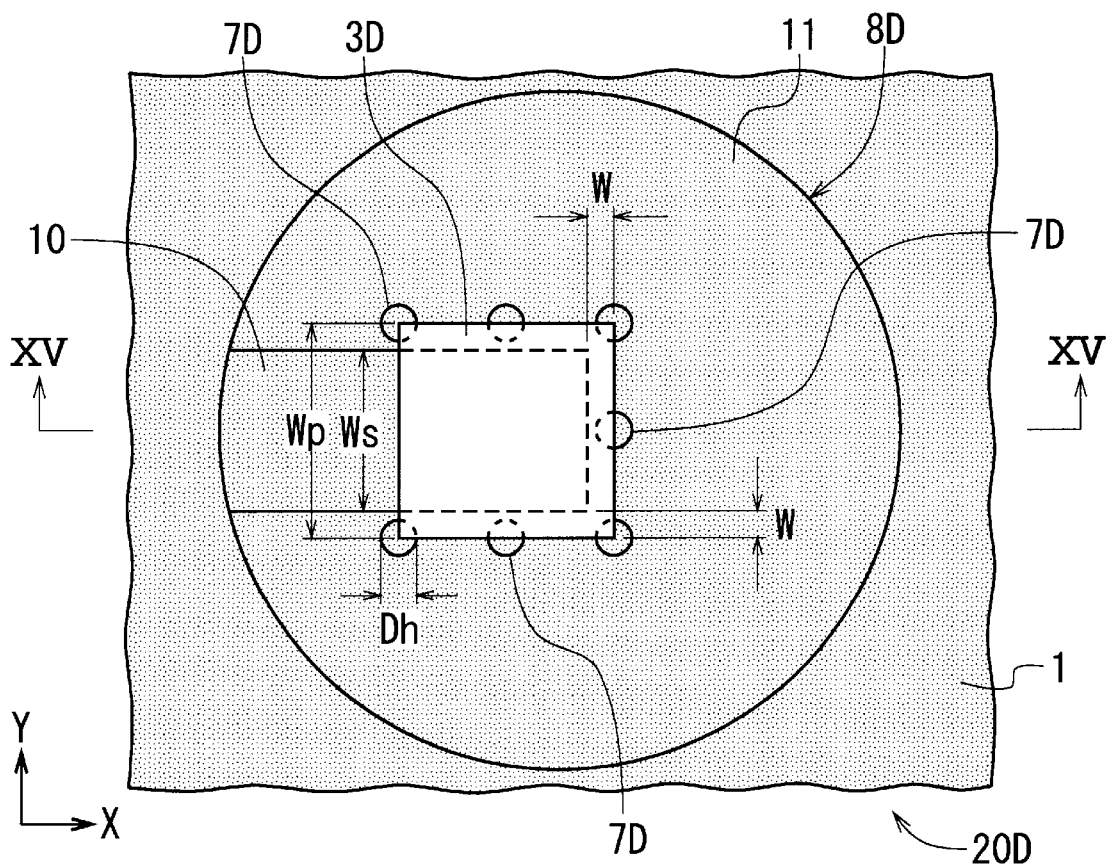
FIG. 14 is a schematic, partial plan view showing the configuration of a pellet picking apparatus according to a fourth embodiment of the invention.
Figure 15:
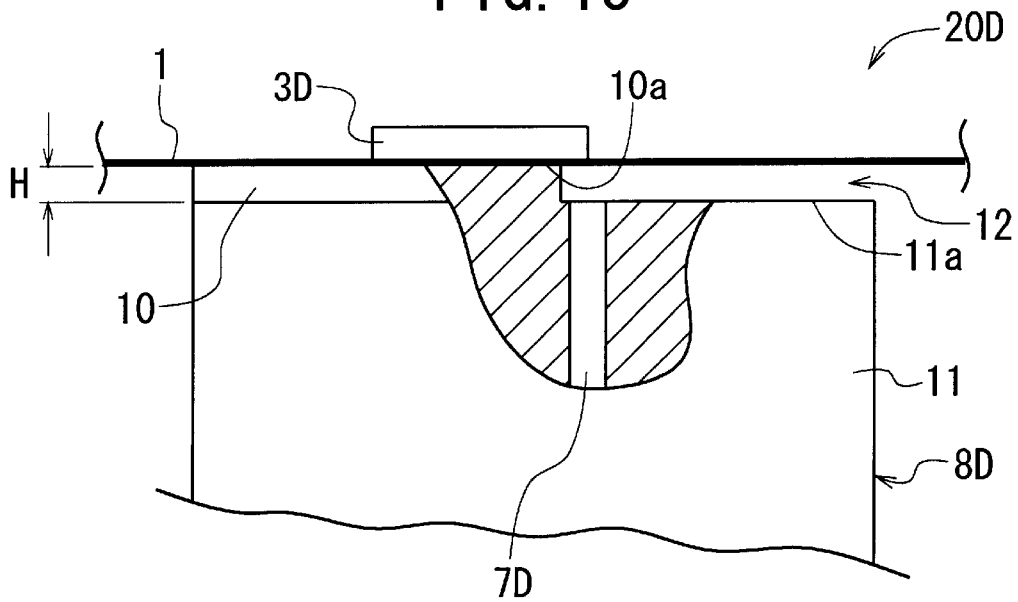
FIG. 15 is a schematic cross-sectional view along the line XV—XV in FIG. 14.

FIGS. 14 and 15 show a pellet picking apparatus 20D according to a fourth embodiment of the invention, in which a collet 4D is omitted.

As shown in FIGS. 14 and 15, the apparatus 20D comprises a stage 8D having a cylindrical body 11 and a protrusion 10 formed on the top surface 11a of the body 11. The stage 8D is connected to a driving mechanism (not shown) for moving horizontally the stage 8D along the X-axis.

The body 11 of the stage 8D has seven suction holes 7D having equal circular cross-sections. These holes 7D are arranged along the periphery of the approximately rectangular protrusion 10. Thus, it is said that the holes 7D are arranged along a U-shaped line. The holes 7D have circular suction ends on the surface 11a of the body 11, where the ends have specific equal diameters Dh.

The height H of the protrusion 10 is a distance from the surface 11a of the body 11 to the surface 10a of the protrusion 10, where H has a specific value. The width Ws of the protrusion 10 is less than the width Wp of the pellet 3D by the width W. In other words, the peripheral area of the pellet 3D overhangs the surface 11a of the body 11 by the width W.

The pellet picking apparatus 20D according to the fourth embodiment operates in the following way.

Specifically, first, as shown in FIGS. 14 and 15, the pellet 3D adhered on the adhesive sheet 1 is aligned on the protrusion 10 of the stage 8D. At this time, a gap 12 is formed between the surface 11a of the body 11 and the sheet 1, as shown in FIG. 15.

Figure 16A:
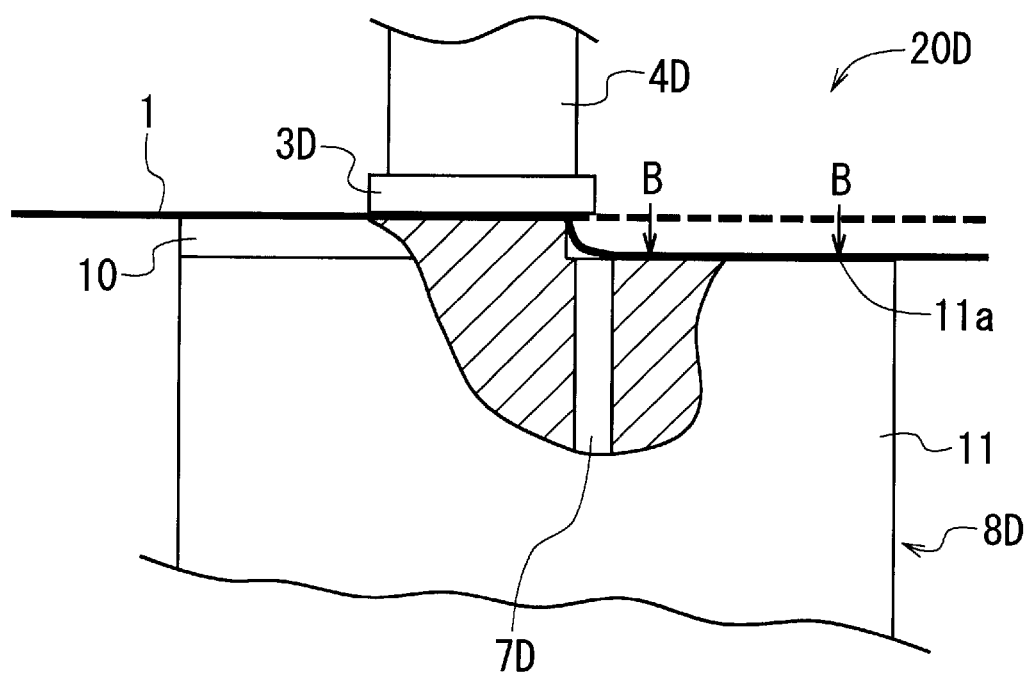
FIGS. 16A and 16B are schematic, partial cross-sectional views showing the operation of the pellet picking apparatus according to the fourth embodiment in FIG. 14, respectively.

Next, as shown in FIG. 16A, the vacuum generator exhausts the air existing in the collet 4D, generating a suction force at the end of the collet 4D. Thus, the pellet 3D is held by the collet 4D due to the suction force. On the other hand, the vacuum generator exhausts simultaneously the air existing in the holes 7D of the stage 8D and therefore, a suction force is generated at the top ends of the holes 7D. Thus, the sheet 1 is sucked downward. At this time, since the air existing in the gap 12 is exhausted through the holes 7D, the part of the sheet 1 overlying the surface 11a is sucked downward to contact the surface 11a along the arrow B in FIG. 16A. As a result, all the overhanging part of the sheet 1 is easily detached from the pellet 3D. This detachment is performed in a moment.

Figure 16B:
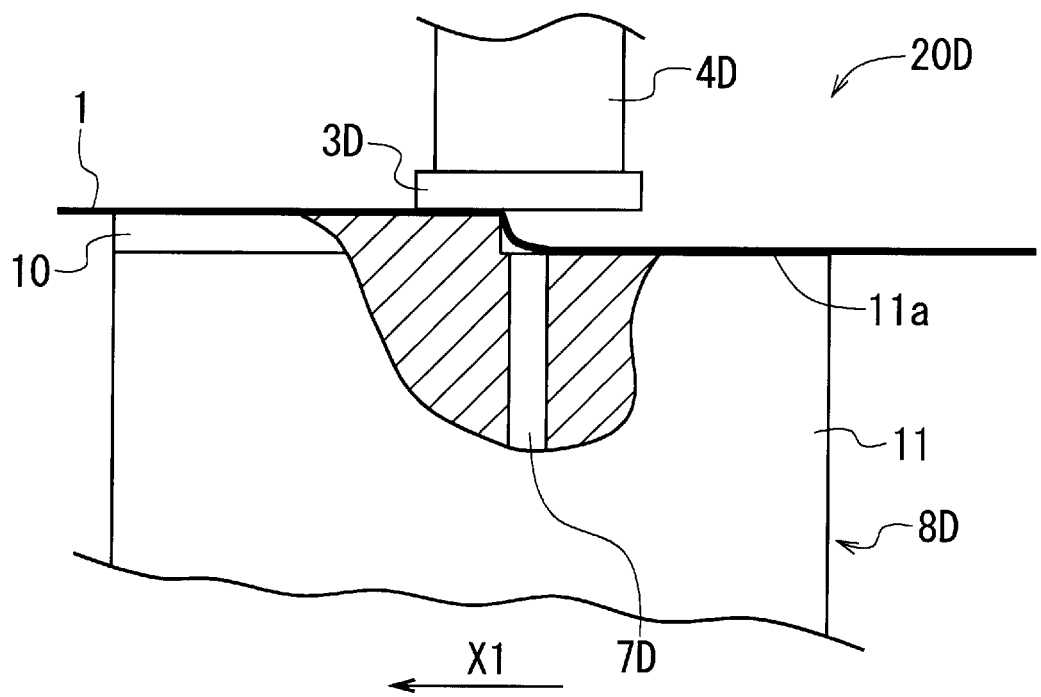

Subsequently, as shown in FIG. 16B, the stage 8D is moved horizontally to the left-hand side along the arrow X1 while the pellet 3D is fixed at its initial position by the collet 4D. Due to this movement, the detached part of the sheet 1 expands along the arrow X1. Finally, the sheet 1 is entirely detached from the pellet 3D.

With the pellet picking apparatus 20D according to the fourth embodiment, because of the same reason as explained in the first embodiment, the pellet 3D is surely prevented from being damaged during the pellet picking process. This means that the picking operation of the pellet 3D without damages is ensured and that the separation failure of the pellet 3D from the sheet 1 is avoided. Also, the fabrication cost of the apparatus 20D can be lowered drastically, which is enabled without lowering the productivity.

The apparatus 20D according to the fourth embodiment is preferably used when the pellet 4D is extremely thin. For example, when the pellet 4D is approximately 0.05 mm in thickness, the apparatus 20D is preferred. This is because almost all the bottom surface of the pellet 3D is placed on the protrusion 10 of the stage 8D at the time the sheet 1 begins to be detached from the pellet 3D and therefore, the downward suction force for the sheet 1 is scarcely applied to the pellet 3D. This means that even if the pellet 3D is extremely thin, it is difficult to be broken.

Unlike this, if the apparatus 20 according to the first embodiment is used for extremely thin pellets, there is a possibility that the pellet is broken along the suction holes 7a and 7b at the time the sheet 1 is sucked downward.

In the apparatus 20D according to the fourth embodiment in FIGS. 14 and 15, the number of the suction holes 7D is set as seven. The three holes 7D are aligned along each long side of the pellet 3D while the remaining hole 7D is located on one short side thereof. However, the invention is not limited to the number and the arrangement.

Figure 17:
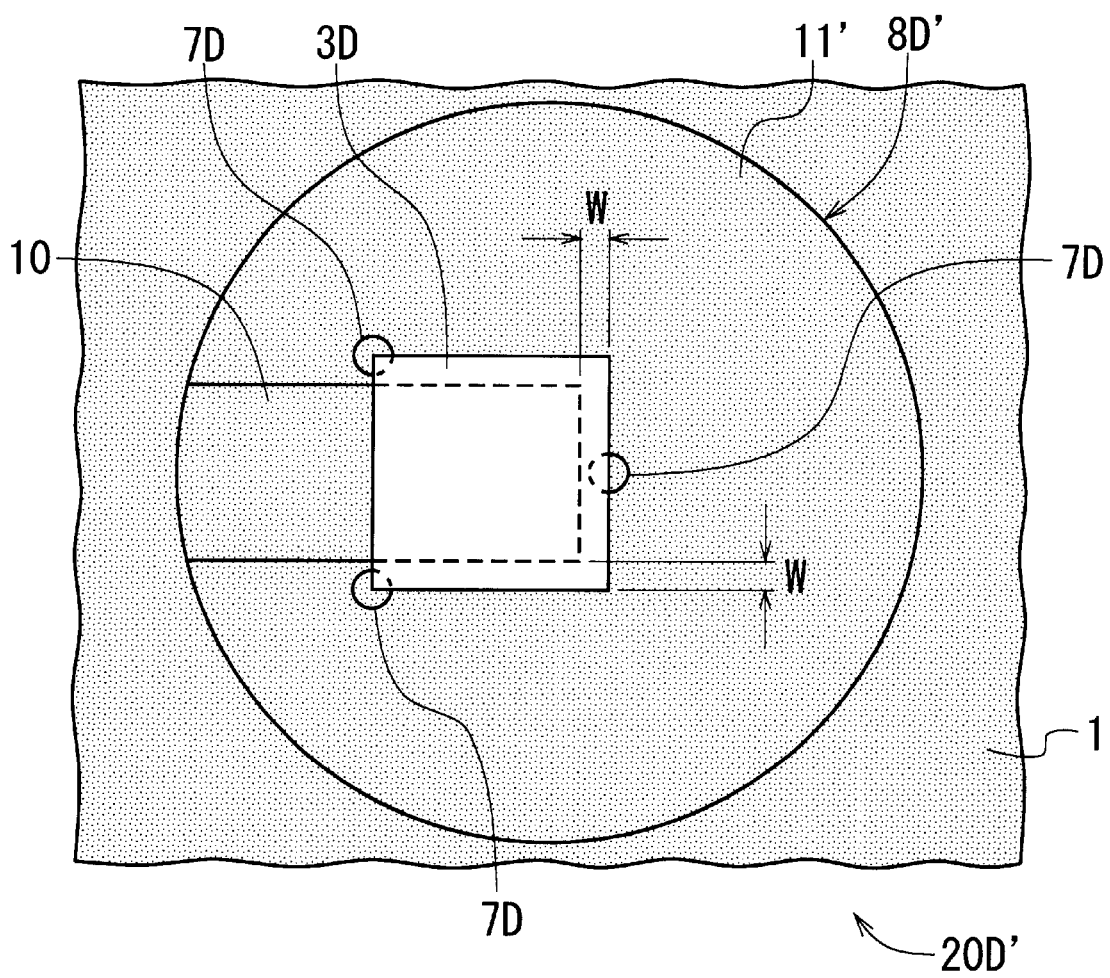
FIG. 17 is a schematic, partial plan view showing a variation of the pellet picking apparatus according to the fourth embodiment in FIG. 14.

For example, as a pellet picking apparatus 20D' shown in FIG. 17, the number of the suction holes 7D may be set as three. In this case, the two holes 7D are formed in the body 11' of the stage 8D' to be located on the adjoining corners of the pellet 3D while the remaining hole 7D is formed in the body 11' to be located on one short side thereof. When the sheet 1 is sucked downward by way of the three holes 7D while the pellet 3D is held by the collet 4D, all the overhanging part of the sheet 1 can be detached from the pellet 3D. Due to the subsequent movement of the stage 8D' along the arrow X1, the sheet 1 is entirely detached from the pellet 3D.

Figure 18:
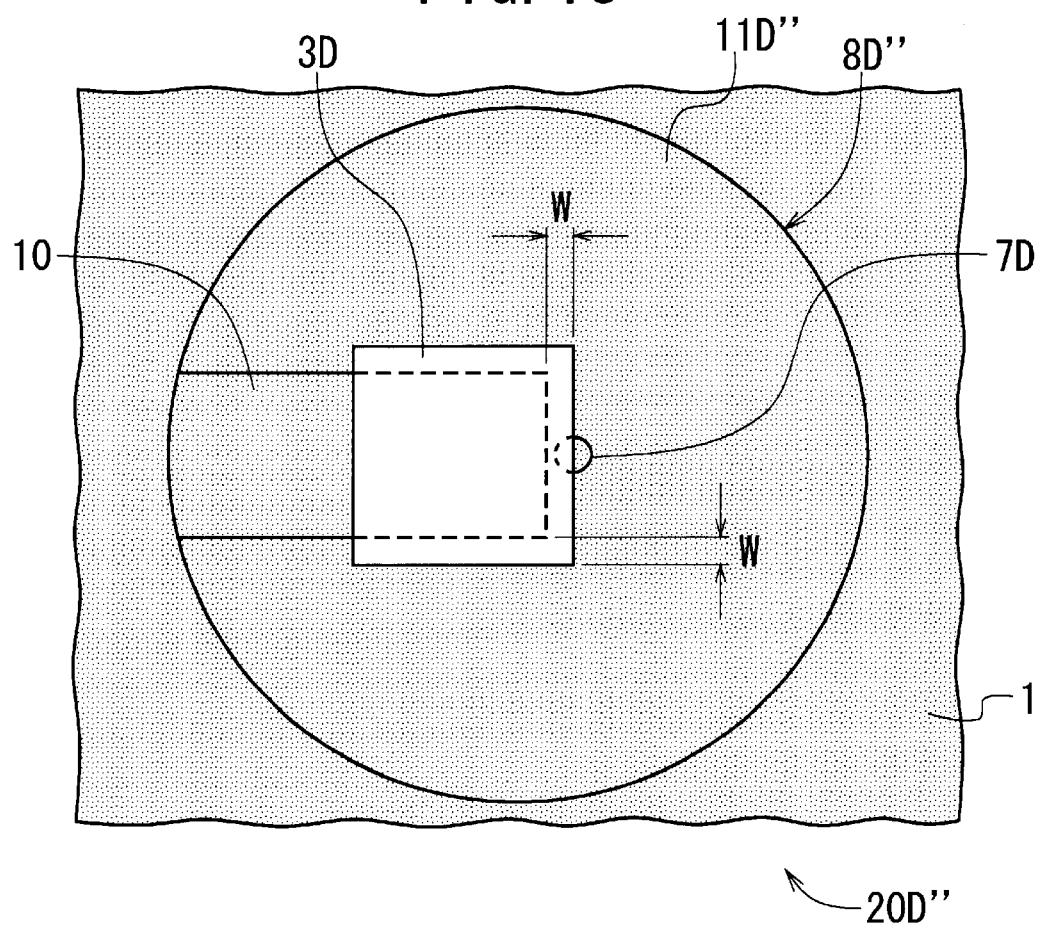
FIG. 18 is a schematic, partial plan view showing another variation of the pellet picking apparatus according to the fourth embodiment in FIG. 14.

Furthermore, as a pellet picking apparatus 20D" shown in FIG. 18, the number of the suction holes 7D may be set as one. In this case, the single hole 7D is formed in the body 11" of the stage 8D" to be located on one short side of the pellet 3D. Even in the apparatus 20D", the sheet 1 can be entirely detached from the pellet 3D in the same way as above.

Fifth Embodiment

Figure 19:
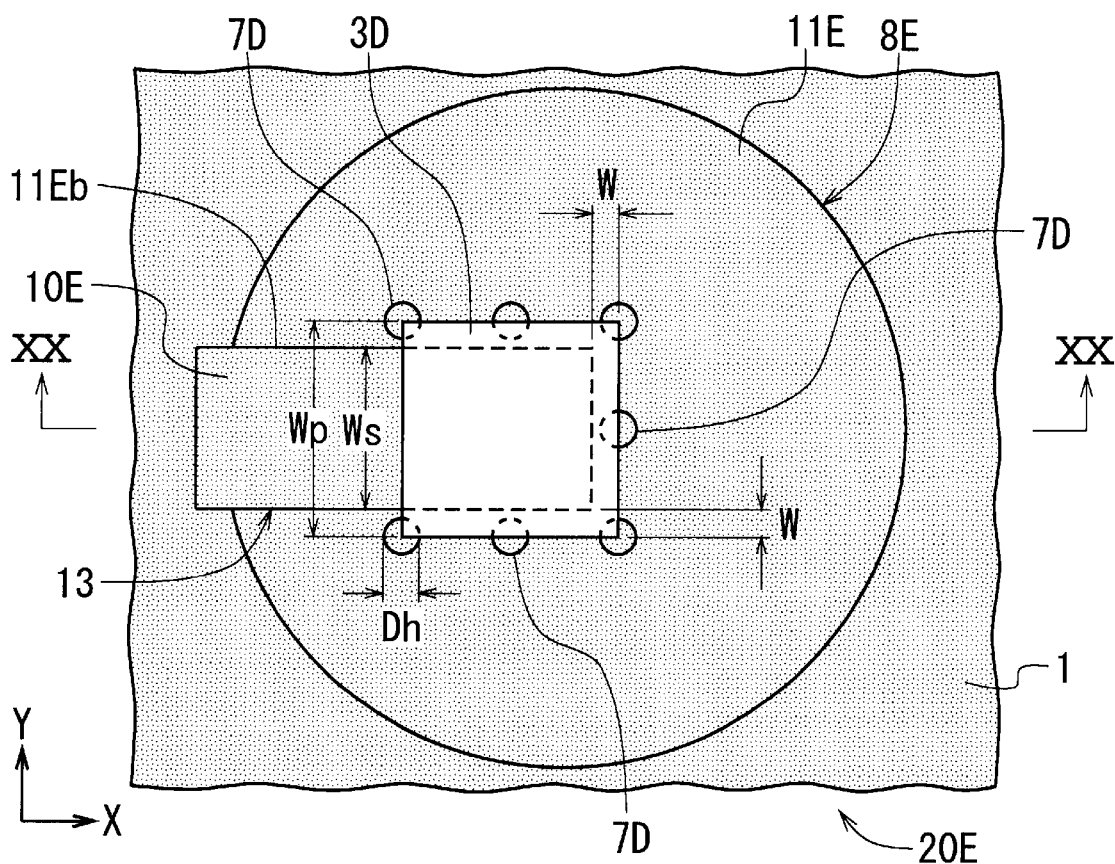
FIG. 19 is a schematic, partial plan view showing the configuration of a pellet picking apparatus according to a fifth embodiment of the invention.
Figure 20:
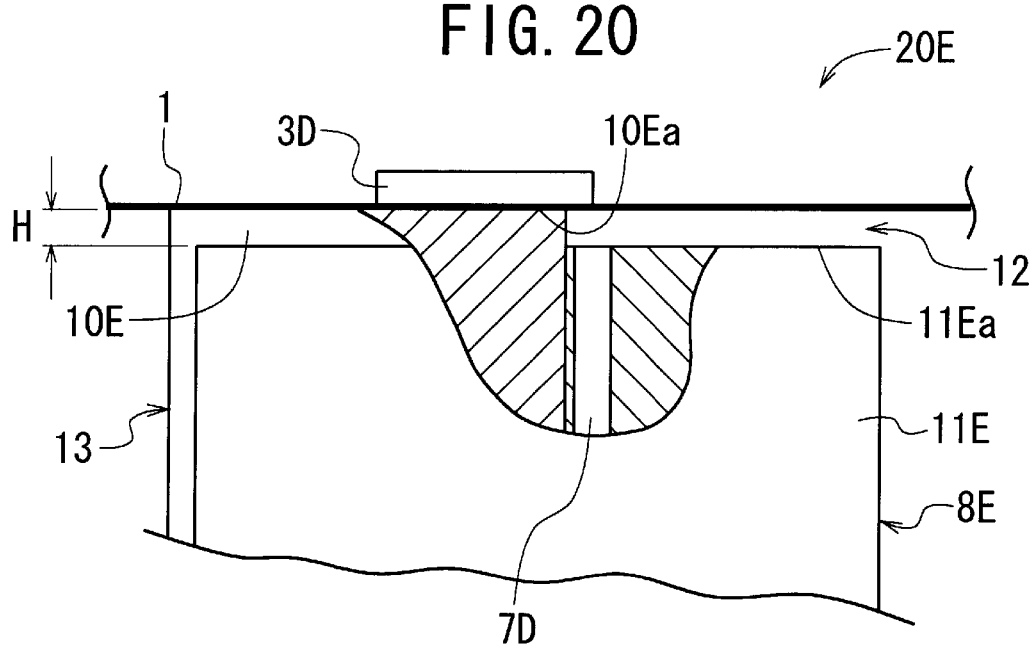
FIG. 20 is a schematic cross-sectional view along the line XX—XX in FIG. 19.

FIGS. 19 and 20 show a pellet picking apparatus 20E according to a fifth embodiment of the invention, in which a collet 4E is omitted.

The apparatus 20E has the same configuration as the apparatus 20D of the fourth embodiment except for the configuration of a stage 8E.

Specifically, as shown in FIGS. 19 and 20, the apparatus 20E comprises the stage 8E having a cylindrical body 11E and a movable member 13 built in the body 11E. Here, the member 13 is a rectangular parallelepiped. The stage 8E is connected to a driving mechanism (not shown) for moving horizontally the stage 8E along the X-axis.

Similar to the apparatus 20D of the fourth embodiment, the body 11E of the stage 8E has seven suction holes 7D having equal circular cross-sections. These holes 7D are arranged along the approximately rectangular periphery of the member 13. Thus, it is said that the holes 7D are arranged along a U-shaped line. The holes 7D have circular suction ends on the surface 11E$a$ of the body 11E, where the ends have specific equal diameters Dh.

The body 11E of the stage 8E has a recess 11E$b$ extending along the radius of the body 11E. The movable member 13 is located in the recess 11E$b$ to be movable along the same radius. The member 13 has a protrusion 10E extending upward from the surface 11E$a$ of the body 11E. The height H of the protrusion 10E is a distance from the surface 11E$a$ of the body 11E to the surface 10E$a$ of the protrusion 10E, where H has a specific value. The width Ws of the member 13, which includes the protrusion 10E, is less than the width Wp of the square pellet 3D by the width W. In other words, the peripheral area of the pellet 3D overhangs the surface 11E$a$ of the body 11E by the width W.

The operation of the pellet picking apparatus 20E according to the fifth embodiment is explained below with reference to FIGS. 20, 21A, 21B, 22A, and 22B.

First, as shown in FIG. 20, the pellet 3D adhered on the adhesive sheet 1 is aligned on the protrusion 10E of the stage 8E. At this time, a gap 12 is formed between the surface 11E$a$ of the body 11E and the sheet 1.

Figure 21A:
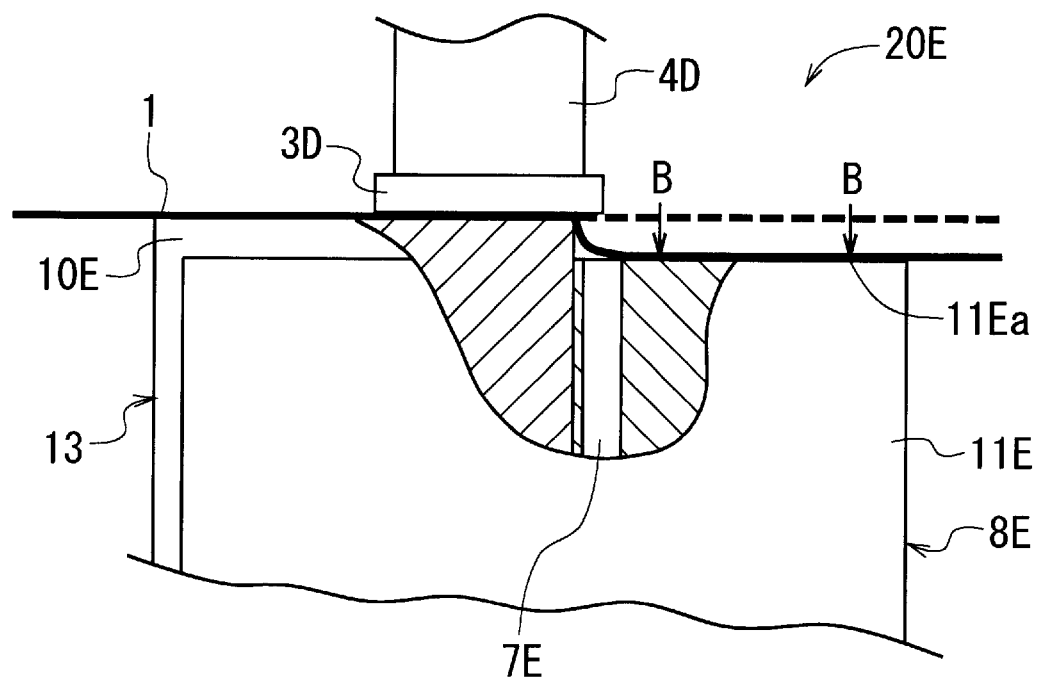
FIGS. 21A and 21B are schematic, partial cross-sectional views showing the operation of the pellet picking apparatus according to the fifth embodiment in FIG. 19, respectively.
Figure 22A:
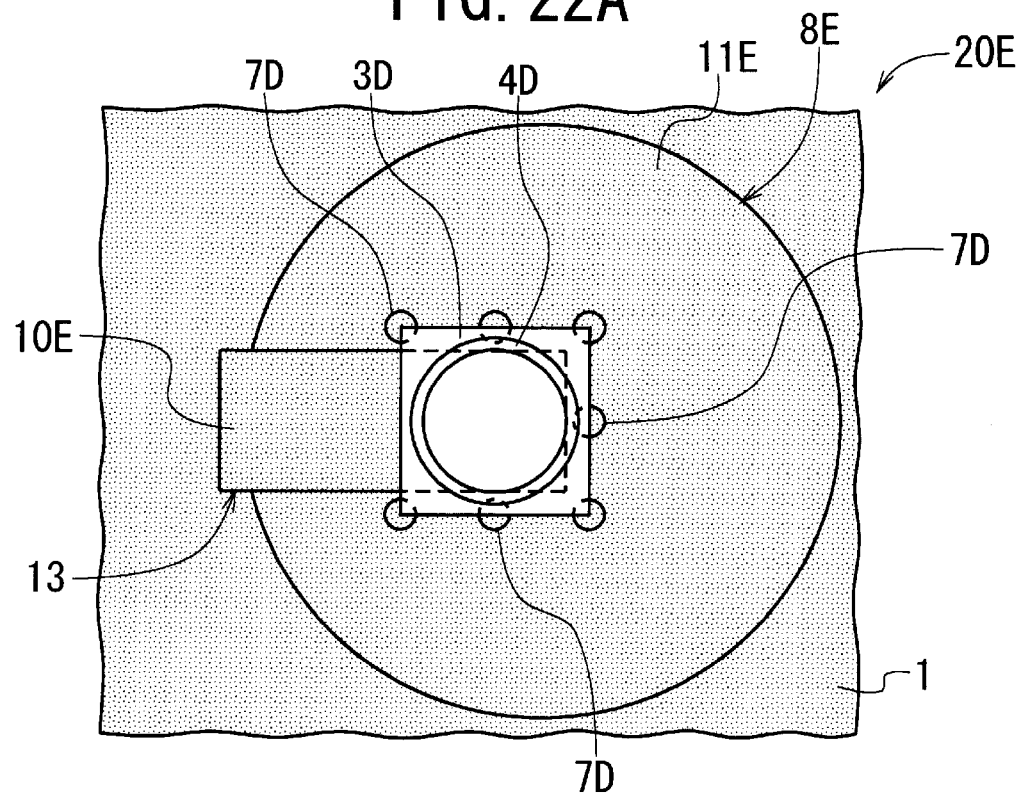
FIGS. 22A and 22B are schematic, partial plan views showing the operation of the pellet picking apparatus according to the fifth embodiment in FIG. 19, respectively.

Next, as shown in FIGS. 21A and 22A, the vacuum generator exhausts the air existing in the collet 4D, generating a suction force at the end of the collet 4D. Thus, the pellet 3D is held by the collet 4D due to the suction force. On the other hand, the vacuum generator exhausts simultaneously the air existing in the holes 7D of the stage 8E and therefore, a suction force is generated at the top ends of the holes 7D. Thus, the sheet 1 is sucked downward. At this time, since the air existing in the gap 12 is exhausted through the holes 7D, the part of the sheet 1 overlying the surface 11E$a$ is sucked downward to contact the surface 11E$a$ along the arrow B in FIG. 21A. As a result, all the overhanging part of the sheet 1 is easily detached from the pellet 3D. This detachment is performed in a moment.

Figure 21B:
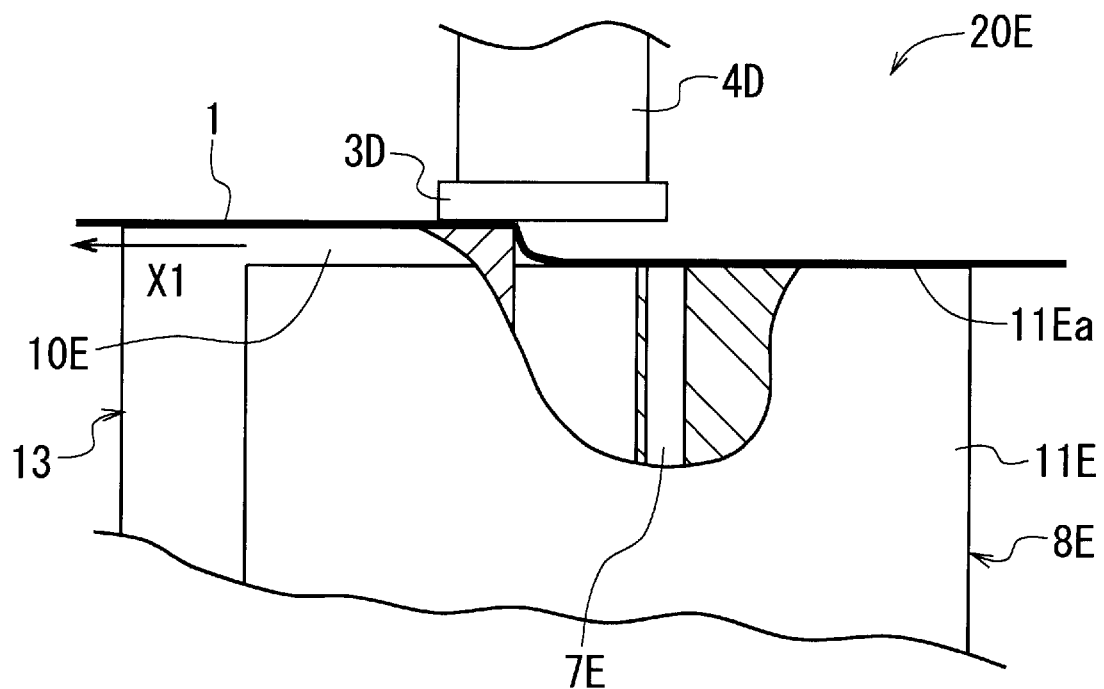
Figure 22B:
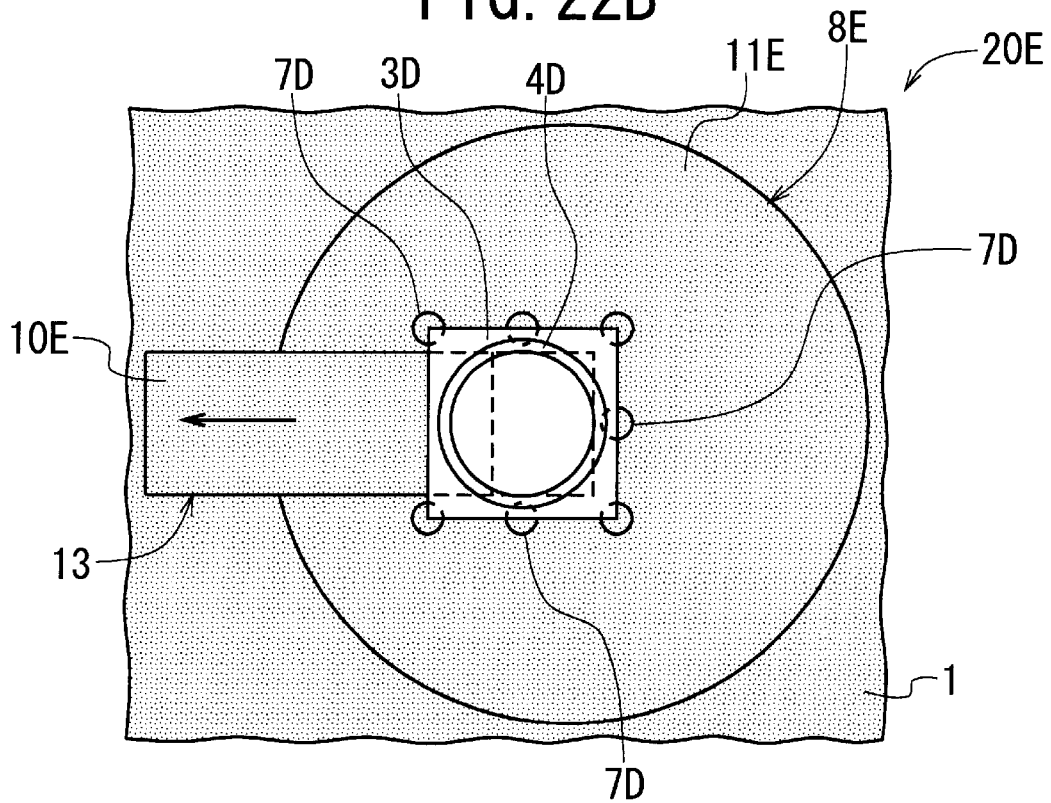

Subsequently, as shown in FIGS. 21B and 22B, the stage 8E is moved horizontally to the left-hand side along the arrow X1 while the pellet 3D is fixed at its initial position by the collet 4D. Due to this movement, the detached part of the sheet 1 expands along the arrow X1. Finally, the sheet 1 is entirely detached from the pellet 3D.

With the pellet picking apparatus 20E according to the fifth embodiment, because of the same reason as explained in the first embodiment, the pellet 3D is surely prevented from being damaged during the pellet picking process. This means that the picking operation of the pellet 3D without damages is ensured and that the separation failure of the pellet 3D from the sheet 1 is avoided. Also, the fabrication cost of the apparatus 20E can be lowered drastically, which is enabled without lowering the productivity.

Additionally, the pellet picking apparatus 20E according to the fifth embodiment has the following advantage with respect to the picking procedure of the pellets 3D arranged in a matrix array on the sheet 1.

Figure 23:
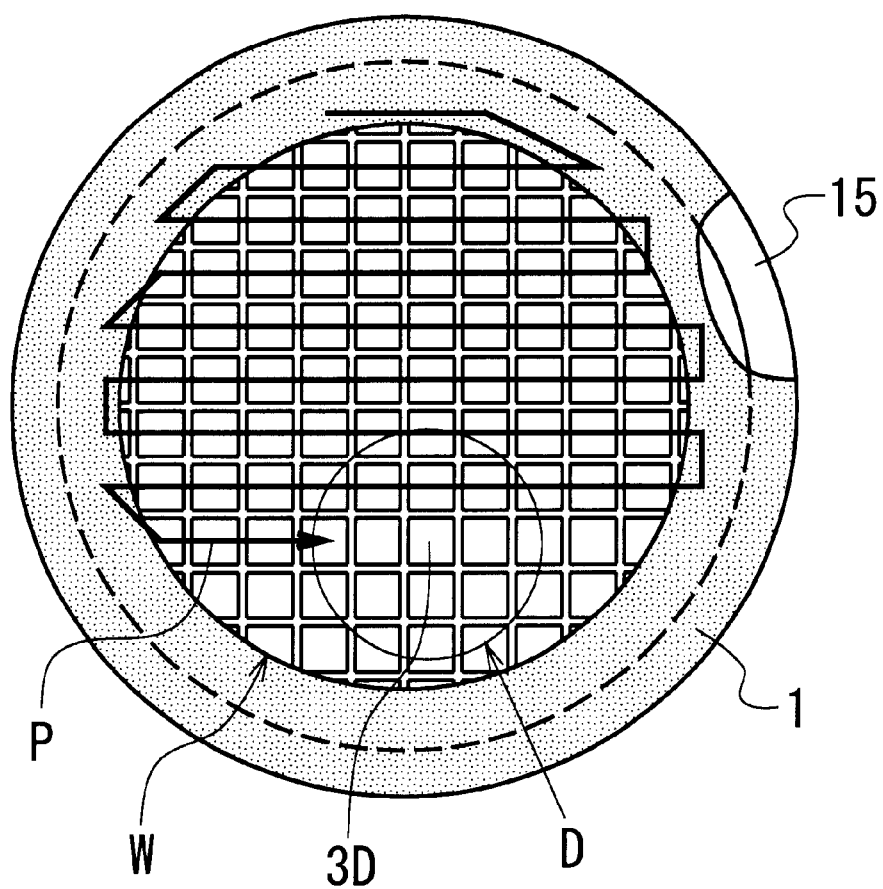
FIG. 23 is a schematic plan view showing the sequential procedure of picking the pellets on the adhesive sheet.

FIG. 23 shows the sequential procedure of picking the pellets arranged on the adhesive sheet in a matrix array.

In FIG. 23, the pellets 3D are formed by separating the semiconductor wafer W that has been adhered on the adhesive sheet 1 into pieces. The pellets 3D thus formed are arranged in the form of matrix on the sheet 1. The reference numeral 15 denotes the support ring for the sheet 1.

The pellets 3D are successively picked up by the apparatus 20E along the zigzag line P with an arrow mark. Prior to the picking operation, the position of the desired pellet 3D on the sheet 1 is recognized by a popular video recognition system. Then, the desired pellet 3D is aligned at the specific position at high accuracy (e.g., approximately ±0.5 mm).

For example, if the apparatus 20D according to the fourth embodiment shown in FIGS. 14 and 15 is used for this purpose, there is a possibility that undesired shift of the sheet 1 occurs when the sheet 1 is entirely detached from the pellet 3D by moving the stage 8D. This is because the sheet 1 is contacted with the stage 8D in a wide area and thus, the sheet 1 tends to be shifted slightly due to friction between the sheet 1 and the stage 8D. This leads to undesired shift or slip of the pellet 3D with respect to the collet 4D. As a result, in spite of the pellet 3D being aligned at high accuracy in advance, the pellet 3D is unable to be placed at the specified position.

Unlike this, when the apparatus 20E according to the fifth embodiment shown in FIGS. 19 and 20 is used for this purpose, the above-described possibility that undesired shift of the sheet 1 occurs is eliminated. This is because only the member 13 (i.e., only the protrusion 10E) is moved in the picking process of the pellet 3D.

Figure 24:
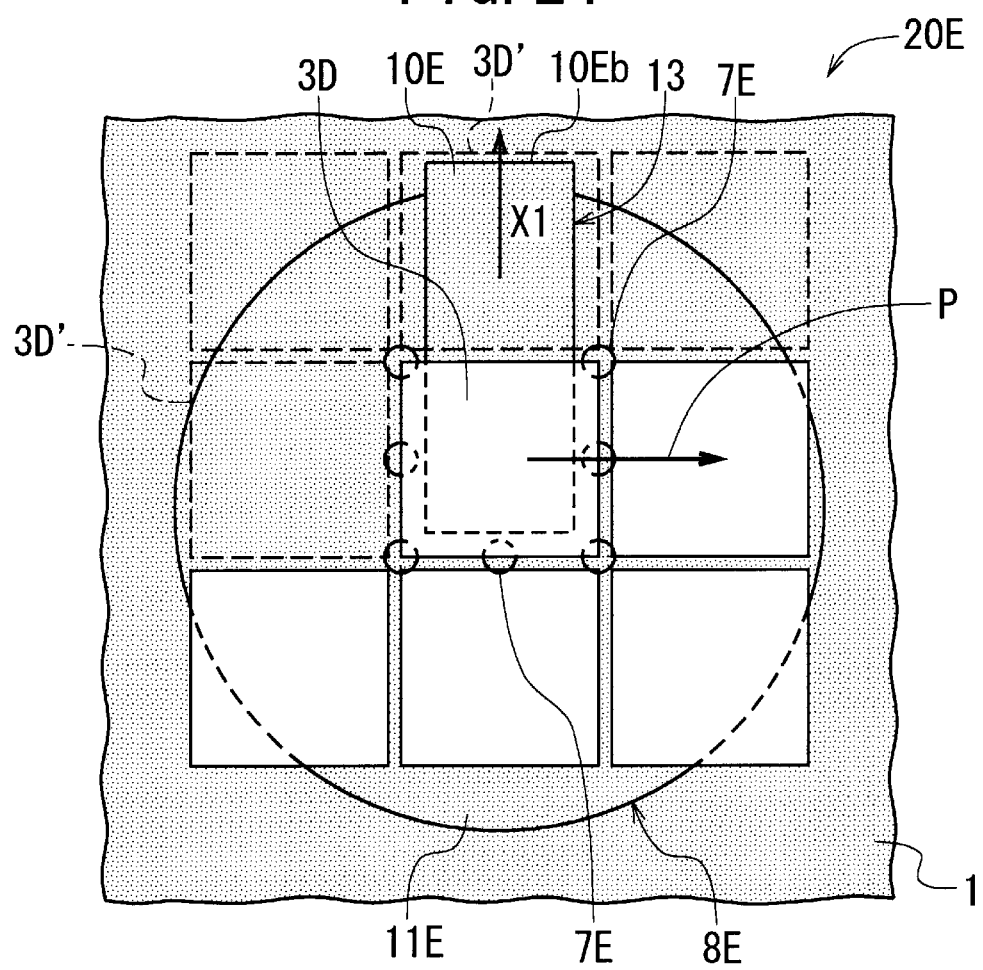
FIG. 24 is a schematic, enlarged, partial plan view of the area D in FIG. 23, which shows the operation of the pellet picking apparatus according to the fifth embodiment in FIG. 19 when the sequential procedure in FIG. 23 is applied thereto.

Moreover, it is preferred that the moving orientation X1 of the member 13 (i.e., the protrusion 10E) is set as shown in FIG. 24. In this case, there is no possibility that the edge 10E$b$ of the protrusion 10E collides with the pellet 3D to break the same, because the pellet 3D' located in the moving orientation X1 of the member 13 has already been picked up.

The edge 10E$b$ of the protrusion 10E may be formed round. In this case, even if the pellet 3D is located in the moving orientation X1 of the member 13, the possibility that the edge 10Eb of the protrusion 10E collides with the pellet 3D to break the same can be lowered. Also, for example, the picking operation for the pellet 3d located at the center of the wafer W (not the pellet 3d located at the top end of the wafer W, as shown in FIG. 23) may be performed first. However, it is ideal that the stage 8E is located shown in FIG. 24.

Sixth Embodiment

Figure 25:
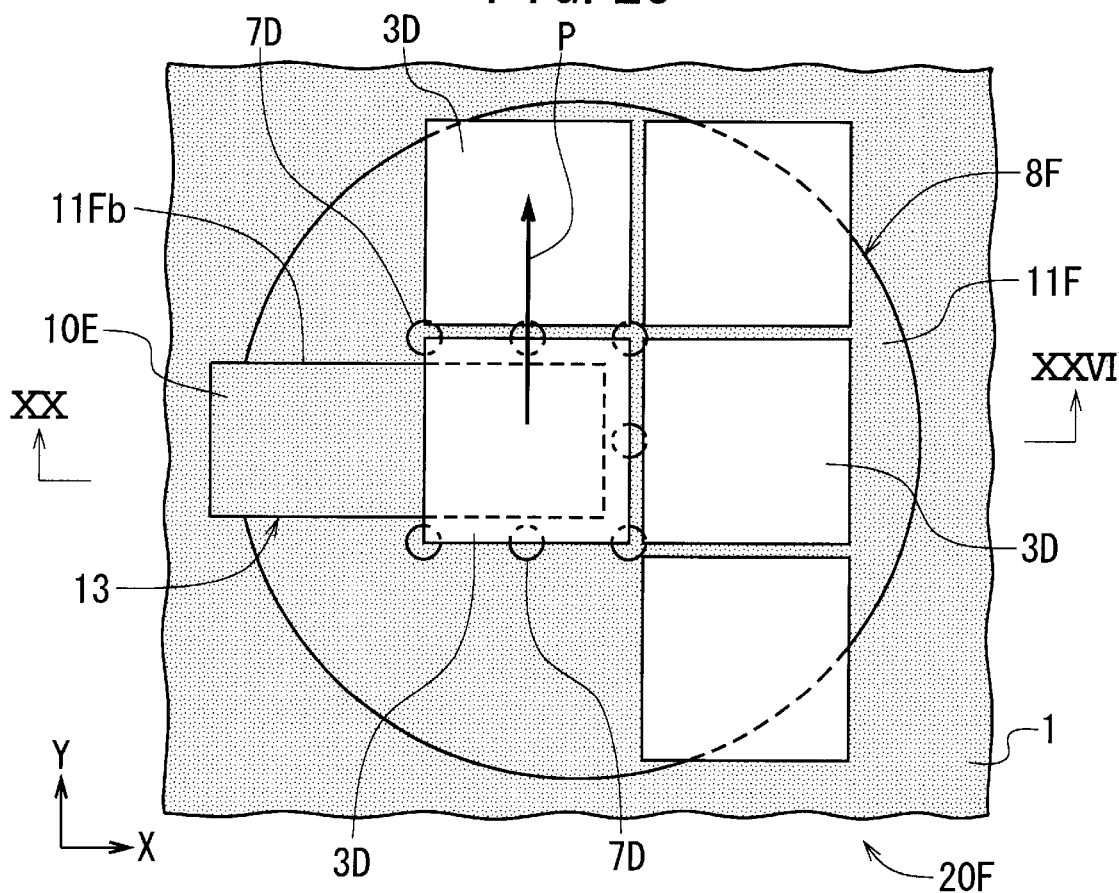
FIG. 25 is a schematic, partial plan view showing the configuration of a pellet picking apparatus according to a sixth embodiment of the invention.
Figure 26:
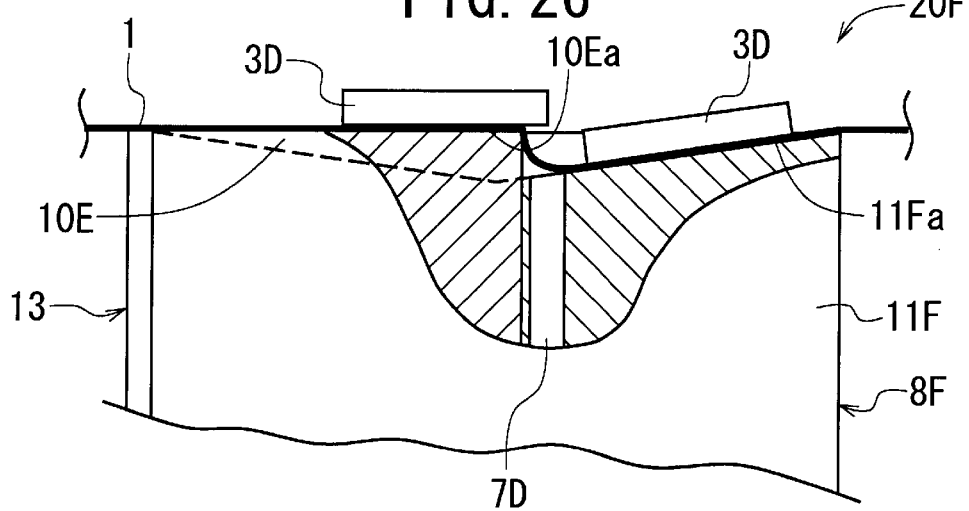
FIG. 26 is a schematic cross-sectional view along the line XXVI—XXVI in FIG. 25.

FIGS. 25 and 26 show a pellet picking apparatus 20F according to a sixth embodiment of the invention, in which a collet 4F is omitted for simplification.

The apparatus 20F has the same configuration as the apparatus 20E of the fifth embodiment of FIGS. 19 and 20 except that the surface 11Fa of a body 11F of a stage 8E is depressed like a cone. Thus, the explanation about the same configuration is omitted by attaching the same reference symbols as those in the fifth embodiment in FIGS. 25 and 26.

Specifically, as shown in FIGS. 25 and 26, the apparatus 20F comprises the stage 8F having the cylindrical body 11F and the movable member 13 built in the body 11F.

The surface 11Fa of the body 11F of the stage 8F is cone-shaped, in which the periphery of the surface 11Fa is higher than the center of the surface 11Fa. The body 11F has the seven suction holes 7D. The body 11F has the recess 11Fb extending along the radius of the surface 11Fa, in which the movable member 13 is built.

With the pellet picking apparatus 20F according to the sixth embodiment, because of the same reason as explained in the first embodiment, there are the same advantages as those in the first embodiment. Also, the apparatus 20F has the following additional advantage.

For example, in the pellet picking apparatus 20C according to the fourth embodiment of FIGS. 14 and 15, the surface 11a of the body 11 of the stage 8D is parallel to the surface 10a of the protrusion 10. Therefore, if the pellet 3D has a high rigidity, the sheet 1 is insufficiently pulled down toward the surface 11a and thus, the sheet 1 is unable to be sucked into the holes 7D as desired. This is applicable to the pellet picking apparatus 20E according to the fifth embodiment of FIGS. 19 and 20.

Unlike this, in the apparatus 20F according to the sixth embodiment, since the surface 11Fa of the body 11F of the stage 8F is cone-shaped, as shown in FIG. 25, the periphery of the body 11F is higher than the center thereof to form a ridgeline. The sheet 1 is contacted with the surface 11Fa in the whole ridgeline. As a result, air leakage is difficult to occur between the holes 7D and the sheet 1, which ensures that the sheet 1 is sucked into the holes 7D.

Additionally, the cone-shaped body 11F of the stage 8F is applicable to the apparatus 20D of the fifth embodiment. This means that the cone-shaped body 11F may be applied to the configuration where the whole stage is moved or only the movable member of the stage is moved.

Seventh Embodiment

Figure 27:
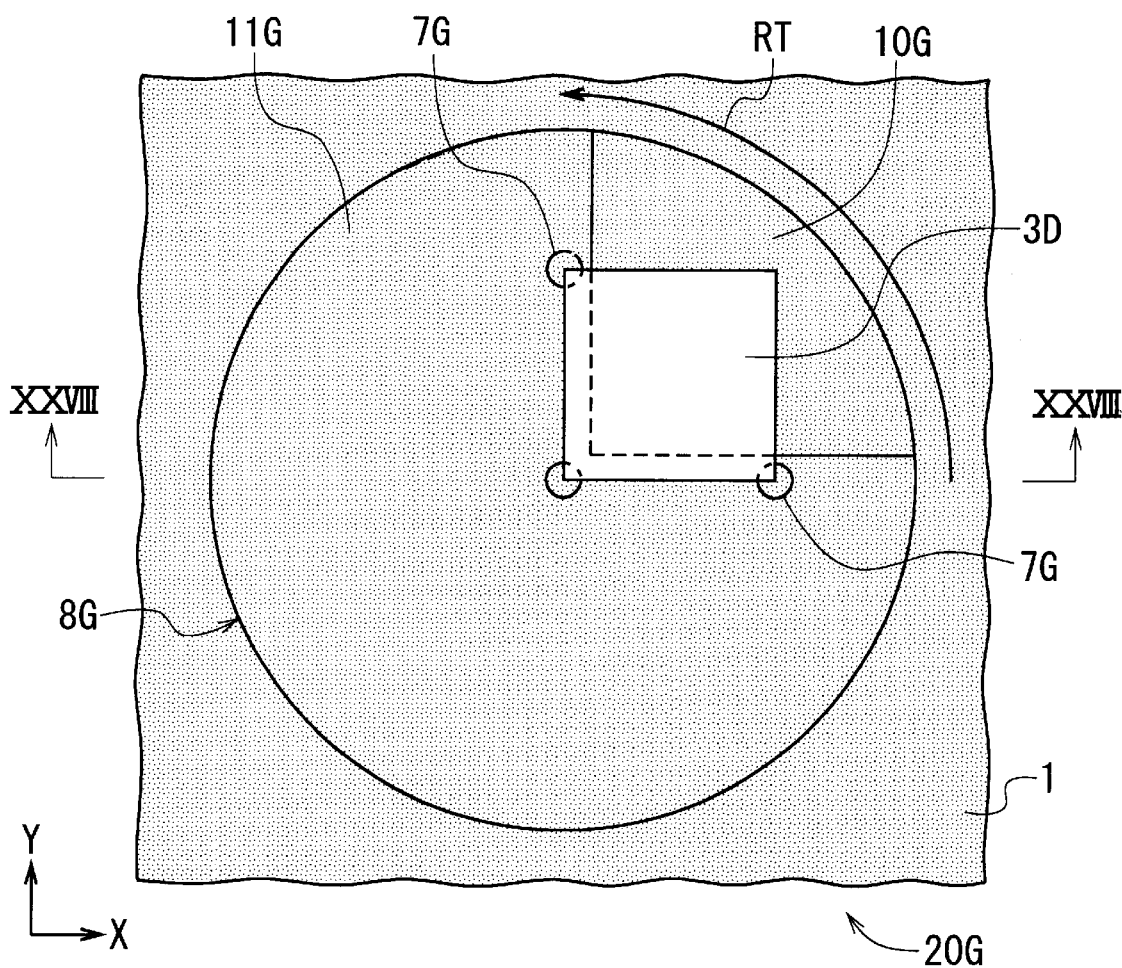
FIG. 27 is a schematic, partial plan view showing the configuration of a pellet picking apparatus according to a seventh embodiment of the invention.
Figure 28:
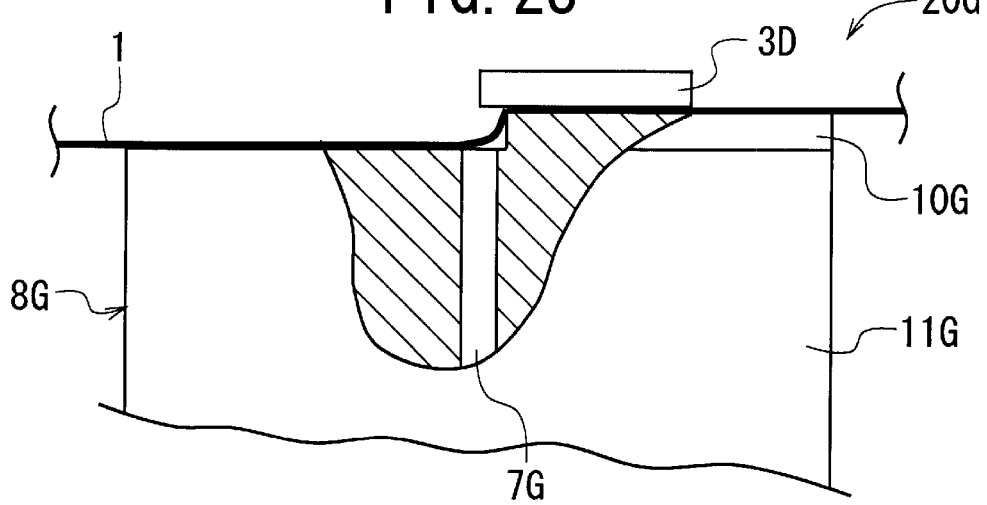
FIG. 28 is a schematic cross-sectional view along the line XXVIII—XXVIII in FIG. 27.

FIGS. 27 and 28 show a pellet picking apparatus 20G according to a seventh embodiment of the invention, in which a collet is omitted for simplification.

The apparatus 20G is comprised of a stage 8G having a cylindrical body 11G and a protrusion 10G formed on the surface 11Ga of the body 11G. The protrusion 10G has a sectional shape that occupies approximately a quarter of the surface 11Ga. The body 11G has three suction holes 7G having equal circular cross-sections. These holes 7G are arranged along the L-shaped periphery of the protrusion 10G. Thus, it is said that the holes 7G are arranged along an L-shaped line. The holes 7G have circular suction ends on the surface 11Ga of the body 11G. The stage 8G is connected to a driving mechanism (not shown) for rotating the stage 8G along the longitudinal axis of the stage 8G in the horizontal plane (i.e., the X-Y plane).

The operation of the pellet picking apparatus 20G according to the seventh embodiment is explained below with reference to FIGS. 29A and 29B.

Figure 29A:
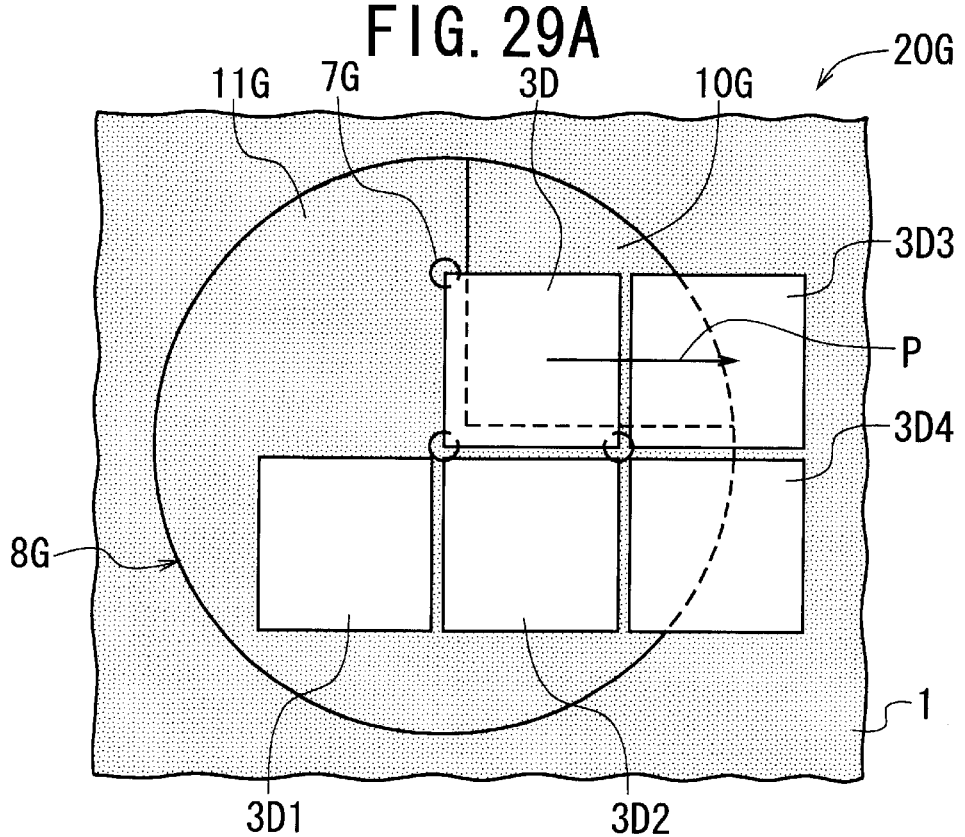
FIGS. 29A and 29B are schematic, partial plan views showing the operation of the pellet picking apparatus according to the seventh embodiment in FIG. 27, respectively.

First, as shown in FIG. 29A, the pellet 3D adhered on the adhesive sheet 1 is aligned on the protrusion 10G of the stage 8G.

Next, as shown in FIG. 28, the pellet 3D is heldby the collet due to the suction force while a suction force is generated at the top ends of the holes 7G. Thus, the overhanging part of the sheet 1 from the protrusion 10G is sucked downward and detached from the pellet 3D.

Figure 29B:
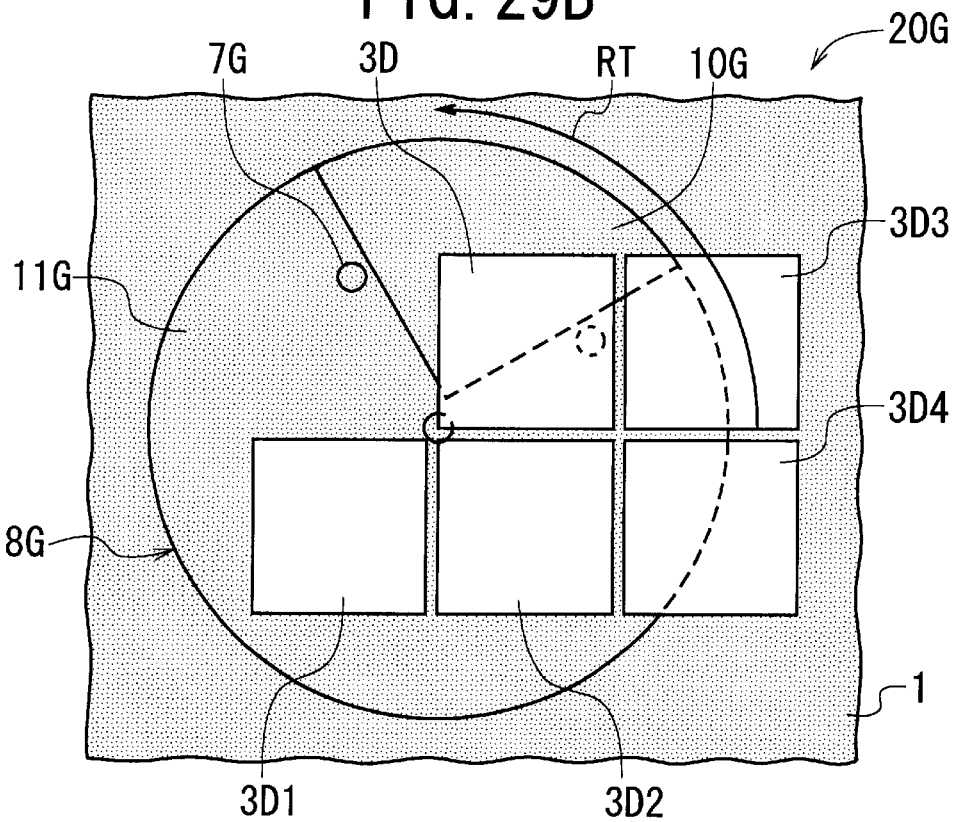

Thereafter, as shown in FIG. 29B, the stage 8G is rotated counter-clockwise along the arrow RT. Then, the detached area of the sheet 1 from the pellet 3D expands according to this rotation. If the stage 8G is rotated by approximately 90°, the sheet 1 is entirely separated from the pellet 3D.

When the apparatus 20G is used for picking the pellets 3D arranged on the sheet 1 in a matrix array one by one, the stage 8G should be rotated counter-clockwise along the arrow RT. This is because if the stage 8G is rotated clockwise, there is a disadvantage that the pellet 3D2 adjoining the desired pellet 3D to be picked is detached from the sheet 1, as shown in FIGS. 29A and 29B.

The rotation angle of the stage 8G is preferably approximately 90°. If the angle is greater than 90°, for example, 270° or 360°, there is a disadvantage that the pellet 3D1 or 3D3 adjoining the desired pellet 3D to be picked is detached from the sheet 1.

In the apparatus 20G according to the seventh embodiment of FIGS. 27 and 28, the surface 11G of the stage 8G may be cone-shaped like the apparatus 20F according to the sixth embodiment. In this case, there is the same additional advantage as that in the sixth embodiment.

The following is the explanation about the dimensions required for designing the apparatuses according to the fourth to seventh embodiments with reference to FIG. 14.

If the overhanging width W is excessively large, the pellet 3D tends to be broken by the suction force downward when the sheet 1 is detached.

If the height H of the protrusion 10 is excessively small, the protrusion 10 does not serve effectively and as a result, the sheet 1 is not easily detached from the pellet 3D. On the other hand, if the height H of the protrusion 10 is excessively large, air leakage tends to occur between the suction holes 7D and the sheet 1. This means that the sheet 1 is unable to be sucked into the suction holes 7D as desired.

The suction hole 7D may be decreased from the size shown in FIG. 14. For example, almost all the hole 7D may be covered with the pellet 3D. However, if the hole 7D is excessively small, the suction force is insufficient or difficult to be processed. The dimension of the hole 7D should be decided taking these conditions into consideration.

To confirm the advantages of the invention, the inventor conducted tests under the following condition.

The pellet picking apparatus 20E according to the fifth embodiment was fabricated while the width W and the height H of the stage were set as approximately 1 mm and approximately 0.5 mm, respectively. The pellet was square of approximately 5 mm×5 mm and 0.05 mm thick. A lot of the pellets were formed by separating the wafer into pieces on the adhesive sheet and were arranged in a matrix array.

As a result, all the pellets on the wafer were safely picked up without any damages. The sheet was scarcely shifted in the picking process. The time for the alignment process was not long.

Moreover, the time for the picking process, which was from the start of the initial lowering operation of the collet to the start of the final elevating operation of the detached pellet, was drastically decreased. Concretely, the time was approximately 0.05 second per pellet in the apparatus 20E according to the fifth embodiment of the invention. On the other hand, it was approximately 0.1 second per pellet in the conventional needle pushing method. This was due to the fact that the pellet picking operation was performed at high speed without damages in the invention compared with the conventional needle pushing method.

The following is explanation on the materials required for the stages of the apparatuses according to the fourth to seventh embodiments.

The protrusion of the stage is preferably made of metal. In this case, hardened metal is more preferred. It is preferred that hardened metal is surface-polished.

Since the protrusion of the stage is frequently rubbed with the adhesive sheet, it is necessary to have high abrasion resistance and high mechanical strength even if the adhesive sheet is thin and made of plastic. At the same time, the protrusion requires a good slip or slide property. These are the reasons for the protrusion being preferably made of metal.

VARIATION

It is needless to say that the invention is not limited to the above-described first to seventh embodiments and any change is applicable thereto.

For example, in the above-described apparatuses, the suction holes are circular. However, the suction holes may be rectangular or elongated. An optimum shape should be selected by considering the separating speed of the sheet from the pellet and the fabrication cost.

Also, in the above-described apparatuses, the vide recognition system (i.e., camera and stage) is fixed on the X-Y plane and therefore, the picking position of the pellet is fixed. The adhesive sheet is moved along with the support ring for positional alignment. However, the invention is not limited to the configuration. The vide recognition system (i.e., camera and stage) and/or the picking position may be movable or changeable. In this case, the entire stage may be mounted on a movable table in the X-Y plane and at the same time, the table is optionally moved as necessary according to the picking position.

Moreover, in the above-described apparatuses, one pellet is picked in each picking process. However, two or more pellets may be picked in each picking process. If the apparatus 20E according to the fifth embodiment is applied, the protrusion of the stage is enlarged so as to link two adjacent pellets. At this time, each of the two pellets needs to be partially located outside the enlarged protrusion while the collet needs to have two suction ends for the two pellets. Then, the sheet is sucked downward by way of the suction holes, detaching the sheet from the pellets. In this case, correct positional alignment is applied to only one of the pellets. The other pellet is simply picked up.

In the above-described apparatuses, semiconductor pellets are used for the object to be picked up. However, the invention may be applied to any other thin, fragile parts. The adhesive sheet may be in the form of tape.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A pellet picking apparatus for separating a pellet adhered on an adhesive sheet from the sheet and picking the pellet this separated; the apparatus comprising:

(a) a stage having a surface with which a lower face of the adhesive sheet is contacted;
   the pellet being adhered on an upper face of the sheet;
   the stage having a suction hole that pulls down the sheet;
   the suction hole having a suction end to be contacted with the sheet on the surface of the stage;
   the stage being movable to translate and rotate in a horizontal plane with respect to a specific reference position; and (b) a collet for holding the pellet by a suction force;
   the collet having a suction end to be contacted with the pellet;
   the collet being capable of holding the pellet by the suction force at the suction end;
   wherein when the sheet is placed on the surface of the stage in such a way that the pellet on the sheet is located at the reference position, the collet is controlled to hold the pellet by the suction force at the suction end and at the same time, the stage is controlled to hold the sheet at the suction end of the suction hole and to be moved in the horizontal plane with respect to the reference position to thereby detach the sheet from the pellet;
   and wherein the collet is controlled to pick the pellet this detached from the sheet.

2. The apparatus according to claim 1, wherein the hole is located under the pellet;
   and wherein an outer part of the hole is located outside of the pellet.

3. The apparatus according to claim 2, wherein the stage is one of: translational and rotational horizontally.

4. The apparatus according to claim 1, wherein the stage has a protrusion on which the surface with which the lower face of the adhesive sheet is contacted while the suction hole is formed on the surface of the stage other than the protrusion;
   and wherein the outer part of the pellet is located outside of the protrusion and sucked by way of the suction hole.

5. The apparatus according to claim 4, wherein only the protrusion of the stage is moved in a horizontal plane when the sheet is detached from the pellet.

6. The pellet picking apparatus of claim 1, wherein the stage has a cylindrical body and a movable member built into the cylindrical body.

7. The pellet picking apparatus of claim 6, wherein the moveable member approximates a rectangular parallelpiped.

8. The pellet picking apparatus of claim 7, wherein the cylindrical body has a plurality of suction holes arranged along the approximately rectangular periphery of the movable member.

9. The pellet picking apparatus of claim 8, wherein the cylindrical body has seven suction holes having approximately equal circular cross-sections.

10. The pellet picking apparatus of claim 7, wherein said plurality of suction holes approximate a U-shaped line.

11. The pellet picking apparatus of claim 6, wherein said stage is moveable horizontally along the X-axis.

12. A pellet picking method for separating a pellet adhered to an adhesive sheet from the sheet and picking the pellet thus separated;

the method comprising the steps of:
(a) providing a stage having a surface with which a lower face of the adhesive sheet is contacted;
the pellet being adhered on an upper face of the sheet;
the stage having a suction hole that pulls down the sheet;
the suction hole having a suction end to be contacted with the sheet on the surface on the stage;
the stage being movable to translate and rotate in a horizontal plane with respect to a specific reference position;
(b) providing a collet for holding the pellet by a suction force;
the collet having a suction end to be contacted with the pellet;
the collet being capable of holding the pellet by the suction force at the suction end;
(c) placing the sheet on the surface of the stage in such a way that the pellet on the sheet is located at the reference position;
(d) holding the pellet by the suction force at the suction end of the collet while at the same time holding the sheet at the suction end of the suction hole of the stage and moving the stage in the horizontal plane with respect to the reference position to thereby detach the sheet from the pellet; and
(e) picking the pellet thus detached from the sheet by the collet.

13. The method according to claim 12, wherein the hole is located under the pellet;
and wherein an outer part of the hole is located outside of the pellet.

14. The method according to claim 13, wherein the stage is one of: translational and rotational horizontally.

15. The method according to claim 12, wherein the stage has a protrusion on which the surface with which the lower face of the adhesive sheet is contacted while the suction hole is formed on the surface of the stage other than the protrusion;
and wherein the outer part of the pellet is located outside of the protrusion and sucked by way of the auction hole.

16. The method according to claim 15, wherein only the protrusion of the stage is moved in a horizontal plane when the sheet is detached from the pellet.

17. The method of claim 12, wherein the stage has a cylindrical body and a movable member built into the cylindrical body.

18. The method of claim 17, wherein the moveable member approximates a rectangular parallelpiped.

19. The method of claim 18, wherein the cylindrical body has a plurality of suction holes arranged along the approximately rectangular periphery of the movable member.

20. The method of claim 19, wherein the cylindrical body has seven suction holes having approximately equal circular cross-sections.

21. The method of claim 18, wherein said plurality of suction holes approximate a U-shaped line.

22. The method of claim 17, wherein said stage is moveable horizontally along the X-axis.

* * * * *